United States Patent
Masuda

(10) Patent No.: US 7,541,848 B1
(45) Date of Patent: Jun. 2, 2009

(54) PLL CIRCUIT

(75) Inventor: Noboru Masuda, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/068,513

(22) Filed: Feb. 7, 2008

(30) Foreign Application Priority Data

Dec. 25, 2007 (JP) ............... 2007-332026

(51) Int. Cl.
*H03L 7/06* (2006.01)
(52) U.S. Cl. ............... 327/147; 327/156; 327/162
(58) Field of Classification Search ......... 327/144–147, 327/156, 162, 163
See application file for complete search history.

(56) References Cited

U.S. PATENT DOCUMENTS

| | | | | |
|---|---|---|---|---|
| 6,701,445 | B1 * | 3/2004 | Majos | 713/500 |
| 6,768,387 | B1 | 7/2004 | Masuda et al. | |
| 6,806,786 | B1 * | 10/2004 | Lam et al. | 331/179 |
| 7,071,743 | B2 * | 7/2006 | Starr | 327/147 |
| 2007/0177703 | A1 | 8/2007 | Senba | |

FOREIGN PATENT DOCUMENTS

| | | |
|---|---|---|
| JP | 2001-257567 | 9/2001 |
| JP | 2005-252723 | 9/2005 |

* cited by examiner

*Primary Examiner*—Lincoln Donovan
*Assistant Examiner*—Hai L. Nguyen
(74) *Attorney, Agent, or Firm*—Reed Smith LLP; Juan Carlos A. Marquez, Esq.

(57) ABSTRACT

Phase jitter of the hybrid control type PLL circuit in a steady state is reduced. A steady state detection circuit determining whether an output of a phase comparison circuit in the hybrid control type PLL circuit frequently changes is provided, determination that a steady state has not been reached is made if the output of the phase comparison circuit does not change for a while, determination that the steady state has been reached if the output of the phase comparison circuit frequently changes, and based on a result of the determination, a control width of controlling a oscillation frequency of a voltage controlled oscillator circuit by a digital control signal is changed or (and) a frequency of changing an analog control signal is changed. Thereby, a control width of the oscillation frequency by the digital control signal after reaching the steady state can be reduced without damaging convergence before reaching the steady state. Therefore, the phase jitter in the steady state can be reduced.

13 Claims, 13 Drawing Sheets

PLL CIRCUIT

CROSS-REFERENCE TO RELATED APPLICATION

The present application claims priority from Japanese Patent Application No. JP 2007-332026 filed on Dec. 25, 2007, the content of which is hereby incorporated by reference into this application.

TECHNICAL FIELD OF THE INVENTION

The present invention relates to a PLL (Phase Locked Loop) circuit, in particular, to technique effectively applied to a hybrid control type PLL circuit including a voltage controlled oscillator controlled by both of a digital control signal and an analog control signal.

BACKGROUND OF THE INVENTION

As for technique examined by the inventor, there is the following technique in the PLL circuit, for example.

In Japanese Patent Application Laid-Open Publication No. 2001-257567 (Patent Document 1), a circuit configuration of a voltage controlled oscillator enabling generation of a clock signal having small jitter even when a power source voltage fluctuates, in the PLL circuit including a phase comparator, a frequency comparator and a voltage controlled oscillator is shown, for example. Specifically, a configuration in which, with respect to a configuration including a ring oscillator and capacitance mutually connected in parallel and a MOS transistor controlling an oscillation frequency by controlling a power source voltage (current) thereof, a second means for controlling the oscillation frequency according to a phase comparison result is provided. This second means is realized by capacitance capable of switching connection/disconnection with respect to the ring oscillator, and according to the phase comparison result, when the capacitance is connected, the oscillation frequency lowers with increase of a load and when the capacitance is disconnected, the opposite operation is performed.

And, in Japanese Patent Application Laid-Open Publication No. 2005-252723 (Patent Document 2), a PLL circuit having a configuration in which the comparison result of the frequency comparator is reflected to a VCO (Voltage Controlled Oscillator) through a processing by an integration circuit, a comparator and a gain adjustment circuit is shown. This frequency comparator compares and determines high and low of the frequency by observing change of a phase of an input clock using three phase periods obtained from three phase clocks from the VCO as a reference. By reflecting the result of such frequency comparator to the VCO through various processes described above, even if false detection of the frequency comparator occurs, influence thereof can be reduced.

SUMMARY OF THE INVENTION

Note that, in the technique of the PLL circuit described above, the following is found by examination by the inventor.

For example, the PLL circuit shown in Patent Document 1 has a configuration of hybrid control controlling the oscillation frequency of the voltage controlled oscillator by digital control and analog control. In the digital control, the switch of connection/disconnection of the capacitance serving as the second means is performed based on a digital signal which is the phase comparison result. On the other hand, in the analog control, a gate voltage of the abovementioned MOS transistor controlling the oscillation frequency is controlled in an analog manner by an output of a charge pump circuit, and charge/discharge of this charge pump circuit is controlled based on the phase comparison result and the frequency comparison result.

FIG. 14 is a circuit diagram showing a schematic configuration of a voltage controlled oscillator circuit included in the PLL circuit examined as a premise of the present invention. The voltage controlled oscillator circuit VCO shown in FIG. 14 reflects characteristics of the voltage controlled oscillator circuit shown in Patent Document 1, and is composed of a ring oscillator circuit OSC, capacitances C1 to C3, an NMOS transistor T1, PMOS transistors T2, T3, a resistor R1 and the like. The ring oscillator circuit OSC is provided between a high potential side power source node Vdd and a second low potential side power source node Vss2. The NMOS transistor T1 is provided between the second low potential side power source node Vss2 and a first low potential side power source node Vss, and by a gate voltage thereof, a supplying current to the ring oscillator circuit OSC is controlled, and as a result, the oscillation frequency of the ring oscillator circuit OSC is controlled through control of a voltage of the second low potential side power source node Vss2.

The capacitance C3, the PMOS transistor T2 and the PMOS transistor T3 are connected in series in order to the high potential side power source node Vdd, and an end of the PMOS transistor T3 is connected to an internal node of the ring oscillator circuit OSC. ON/OFF of the PMOS transistor T2 is controlled by a digital control signal S_DG. When the PMOS transistor T2 is controlled to ON, the capacitance C3 is added to the ring oscillator circuit OSC. Therefore, by controlling the PMOS transistor T2 to OFF, the oscillation frequency can be set to relatively high, and by controlling the same to ON, the oscillation frequency can be set to relatively low. Note that, a gate of the PMOS transistor T3 is connected to the second low potential side power source node Vss2, and is normally kept at an ON state. This PMOS transistor T3 is for preventing coupling noise involved in ON/OFF of the digital control signal S_DG from directly influencing the internal node of the ring oscillator circuit OSC, and may be omitted in some cases. Thus, by using digital control by the digital control signal S_DG, microscopic change of the oscillation frequency caused by thermal noise and the like of the ring oscillator circuit OSC can be corrected all at once by a single control.

On the other hand, to a gate of the NMOS transistor T1, an analog control signal S_AG is applied via a low pass filter composed of a resistor R1 and capacitance C2. By using the digital control described above in combination, high speed operation is not required for analog control by the analog control signal S_AG. Therefore, the analog control signal S_AG can be connected via the low pass filter, and furthermore, capacitance C1 can be provided between the high potential side power source node Vdd and the second low potential side power source node Vss2. Accordingly, fluctuation of an analog control voltage and fluctuation of a power source voltage applied to the ring oscillator circuit OSC caused by sudden power source noise and the like can be suppressed as much as possible, and therefore, fluctuation of the oscillation frequency caused by them can be suppressed.

Here, if the configuration of Patent Document 1 is employed, the digital control signal S_DG alternately transits between a high level and a low level reflecting the phase comparison result in a steady state, for example, and according to this, connection/disconnection of the capacitance C3 is alternately switched. In this state, frequency adjustment by the analog control converges and frequency fluctuation of a control width involved in the digital control is applied upward and downward around the converged frequency. The control width of the frequency involved in the switching of the capacitance C3 in the digital control is required to ensure a size of an extent correcting high speed noise by thermal noise of the ring oscillator circuit OSC. It is preferable that the size of the control width by the digital control is the necessity minimum because it becomes a jitter component in the steady state.

On the other hand, it is preferable that the minimum control width of the frequency by the analog control is about $1/5$ to $1/10$ or lower of the control width by the digital control, for example. Thereby, when change equivalent to the control width occurs in the analog control, the control widths of the digital control appropriately overlaps before and after thereof, and suitable frequency adjustment can be realized. Therefore, in order to reduce the control width of the digital control as described above, the control width of the analog control has to be reduced as much as that.

However, in order to reduce the control width of the analog control, a charge movement amount per one charge and discharge by the charge pump circuit has to be reduced. To realize this, elements such as transistor configuring the charge pump circuit must be made small. However, there is a limit to the minimum size of the element which can be created in semiconductor technology used, and the charge movement amount per one time of the charge pump circuit configured with the element of such size is the limit of the reduction. Therefore, a limit of reduction of the control width of the digital control and a limit of reduction of the phase jitter are determined by this.

An object of the present invention is to remove the limit of the minimum control width of a frequency and to enable further reduction of phase jitter, in the PLL circuit.

The present invention is proposed in view of the above, and the above and other objects and novel characteristics of the present invention will be apparent from the description of this specification and the accompanying drawings.

The typical ones of the embodiments disclosed in this application will be briefly described as follows.

That is, the PLL circuit of the typical embodiment includes a means for detecting whether the steady state has been reached and performs partially different operation between a case in which the steady state has been reached and a case in which the steady state has not been reached.

For example, if the steady state has not been reached, the charge movement amount per one cycle on average is reduced by lowering frequencies of charge and discharge by the charge pump circuit. If the steady state has been reached, the frequencies of charge and discharge cannot be lowered in order to keep the state. Instead, however, since charge and discharge are performed in a substantially alternating manner if the steady state has been reached, the charge and the discharge cancel each other and it becomes substantially zero on average.

As described above, in the PLL circuit of the hybrid control type, since high speed operation is not required for the control by the analog control signal, effect of charge and discharge by the charge pump circuit can be made not to appear in all immediately and to appear gradually at a predetermined time constant. Therefore, if the charge movement amount per one cycle on average is small over a time equivalent to the time constant, problems do not occur even if the control width of the analog control by the charge movement per one cycle exceeds about $1/5$ to $1/10$ of the control width of the digital control.

In another configuration example, the control width by the digital control is made large if the steady state has not been reached, and made small if the steady state has been reached. If the steady state has not been reached, since the phase jitter does not need to be made small, the control width by the digital control can be made large, and the control width per one cycle by the analog control can be made to appear to be relatively small compared with the control width by the digital control. If the steady state has been reached, although the control width by the digital control has to be made small to reduce the phase jitter, the control width of the analog control per one cycle becomes small on average because charge and discharge cancel each other in the steady state, as described above.

A means for detecting whether the steady state has been reached is configured by, for example, a circuit determining whether an output of the phase comparison circuit frequently changes. If the steady state has been reached, since phase difference and frequency difference hardly exist, the phase comparison result is alternately switched for every one cycle in many cases, and phase relationship inverts for every one cycle by high speed digital control. Actually, since the charge movement amounts of charge and discharge by the charge pump circuit differs, the phase comparison circuit sometimes outputs the same value successively for two cycles. Furthermore, noise and the like are added, the same value may be outputted successively for three cycles at a still lower possibility. On the other hand, in a case where the phase is not in the steady state when the oscillation frequency has a substantially steady value, since the phase does not easily invert, the phase comparison circuit outputs the same value over a great number of cycles. Accordingly, if the phase comparison circuit outputs the same value over a time longer than or equal to a certain extent, determination that the steady state has not been reached is made, and if it changes at a time shorter than that, determination that the steady state has been reached is made, so that whether the steady state has been reached can be detected.

Note that, as described above, a case in which the phase comparison circuit outputs the same value successively for three cycles even if the steady state has been reached exists although at a low probability. On the other hand, if the phase comparison circuit outputs the same value successively for four cycles, the steady state has not been reached in most cases. Therefore, normally, it is nearly best to determine that the steady state has not been reached if the phase comparison circuit outputs the same value successively for four cycles. Note that, design setting the value other than four cycles can be made.

According to the typical embodiment, the control width by the digital control signal can be reduced and the phase jitter can be reduced in the PLL circuit of the hybrid control type.

BRIEF DESCRIPTIONS OF THE DRAWINGS

DESCRIPTIONS OF THE PREFERRED EMBODIMENTS

In the following embodiments, a description will be given by dividing into a plurality of sections or embodiments as occasion demands as a matter of convenience, however, the elements are not nothing to each other except a particularly clear description, but one is a modified example, details, a supplementary explanation or the like of a part or a whole of the other. Further, in the following embodiments, in the case of referring to a number of elements (including a number, a numerical value, an amount, a range and the like), the present invention is not limited to the defined number except the case of the particular definition and the case of apparently limited to the specific number in principle, but may be equal to or more than the defined number or equal to or less than the defined number. Note that the same components are denoted by the same reference symbols throughout the drawings for describing the embodiment, and the repetitive description thereof will be omitted.

Furthermore, a circuit element configuring each functional block of the embodiments is not particularly limited, but is formed over a semiconductor substrate such as monocrystalline silicon through integrated circuit technique such as a known CMOS (Complementary MOS transistor). In the embodiments, a MISFET (Metal Insulator Semiconductor Field Effect Transistor) is used as one example of a transistor, and a MOS (Metal Oxide Semiconductor) transistor is used as one example thereof. In each drawing, a P-channel MOS transistor (PMOS transistor) is distinguished form an N-channel MOS transistor (NMOS transistor) by adding a symbol of circular mark to a gate.

The embodiments of the present invention will be described in detail with reference to the accompanying drawings.

First Embodiment

Figure 1:
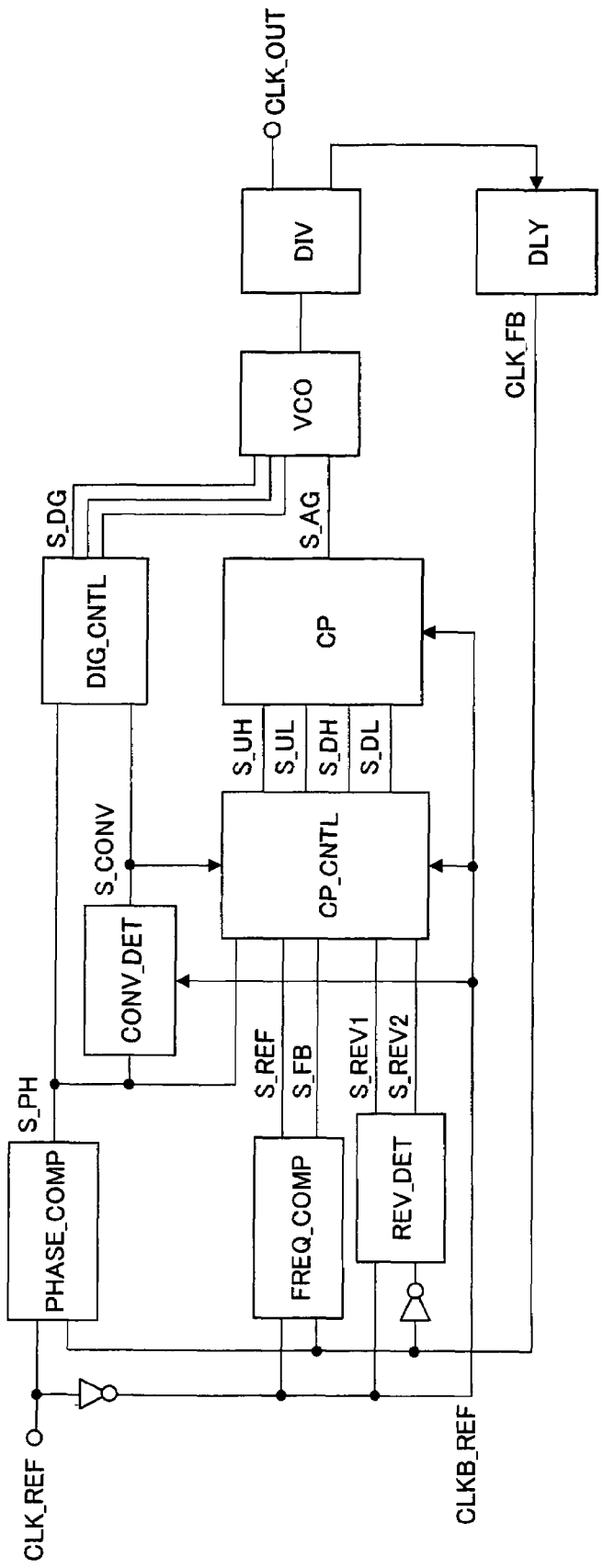
FIG. 1 is a block diagram showing a configuration example of a PLL circuit according to a first embodiment of the present invention.

FIG. 1 is a block diagram showing a configuration example of a PLL circuit according to a first embodiment of the present invention.

The PLL circuit shown in FIG. 1 is composed of a phase comparison circuit PHASE_COMP, a frequency comparison circuit FREQ_COMP, a phase reverse detection circuit REV_DET, a steady state detection circuit CONV_DET, a digital control circuit DIG_CNTL, a charge pump control circuit CP_CNTL, a charge pump circuit CP, a voltage controlled oscillator circuit VCO, a frequency division circuit DIV, a delay circuit DLY and the like.

The voltage controlled oscillator circuit VCO receives a digital control signal S_DG of three bit configuration and an analog control signal S_AG and generates a clock signal having an oscillation frequency controlled based on the signals.

The frequency division circuit DIV frequency-divides the clock signal generated by the voltage controlled oscillator circuit VCO and outputs a clock signal CLK_OUT having a divided frequency. The clock signal CLK_OUT is provided to each flip-flop circuit and the like via a supply path of a clock tree and the like included in a semiconductor integrated circuit device. And, the frequency division circuit DIV frequency-divides the clock signal generated by the voltage controlled oscillator circuit VCO for feedback, and the signal obtained by the frequency-division becomes a feedback clock signal (feedback signal) CLK_FB by via the delay circuit DLY. Note that, the delay circuit DLY has a delay amount reflecting a clock distribution path from the frequency division circuit DIV to each flip-flop circuit, and is provided to adjust a phase at a point where the clock signal CLK_OUT is actually inputted to each flip-flop circuit to conform to a phase of a reference clock signal (reference signal) CLK_REF.

The phase comparison circuit PHASE_COMP compares phases of the reference signal (standard signal) CLK_REF and the feedback signal CLK_FB and outputs an output S_PH of the phase comparison circuit obtained as a comparison result to the steady state detection circuit CONV_DET, the digital control circuit DIG_CNTL and the charge pump control circuit CP_CNTL.

The frequency comparison circuit FREQ_COMP compares frequencies of an inverted reference signal CLKB_REF obtained by inverting the reference signal CLK_REF and the feedback signal CLK_FB and outputs two outputs S_REF, S_FB of the frequency comparison circuit to the charge pump control circuit CP_CNTL as comparison results.

The phase reverse detection circuit REV_DET compares a signal obtained by inverting the feedback signal CLK_FB and the inverted reference signal CLKB_REF and outputs two outputs S_REV1, S_REV2 of the phase reverse detection circuit to the charge pump control circuit CP_CNTL as results of determination whether phase reverse occurs.

The steady state detection circuit CONV_DET determines whether the whole PLL circuit of FIG. 1 has reached a steady state based on the output S_PH of the phase comparison circuit PHASE_COMP and outputs an output S_CONV of the steady state detection circuit obtained as a determination result to the digital control circuit DIG_CNTL and the charge pump control circuit CP_CNTL.

The digital control circuit DIG_CNTL outputs the digital control signal S_DG of three bits controlling the voltage controlled oscillator circuit VCO based on the output S_PH of the phase comparison circuit PHASE_COMP and the output S_CONV of the steady state detection circuit CONV_DET.

The charge pump control circuit CP_CNTL outputs four types of control signals S_UH, S_UL, S_DH and S_DL to the charge pump circuit CP based on outputs of the phase comparison circuit PHASE_COMP, the frequency comparison circuit FREQ_COMP, the phase reverse detection circuit REV_DET and the steady state detection circuit CONV_DET. The control signal S_UH is outputted in a case of greatly increasing the oscillation frequency and the control signal S_UL is outputted in a case of slightly increasing the oscillation frequency. On the other hand, the control signal S_DH is outputted in a case of greatly reducing the oscillation frequency and the control signal S_DL is outputted in a case of slightly reducing the oscillation frequency.

The charge pump circuit CP receives the four types of control signals S_UH, S_UL, S_DH and S_DL from the charge pump control circuit CP_CNTL and charges/discharges a charge amount corresponding to the respective control signals to a node of the analog control signal S_AG. And, the steady state detection circuit CONV_DET, the charge pump control circuit CP_CNTL, the charge pump circuit CP and the like operate in synchronization with the inverted reference signal CLKB_REF.

Next, a summary of state transition from power-ON to the steady state of the whole of the PLL circuit of FIG. 1 is described.

Since the voltage controlled oscillator circuit VCO does not oscillate or oscillates at a frequency that greatly differs from a target oscillation frequency for a while from a timing immediately after the power-ON, frequencies of the reference signal CLK_REF and the feedback signal CLK_FB greatly differ. In this period, the frequency comparison circuit FREQ_COMP and the phase reverse detection circuit REV_DET frequently output a signal indicating that the frequencies differ or a signal indicating that the phases are reversed, and control based on the outputs S_REF, S_FB of the frequency comparison circuit is dominant in control of the charge pump circuit CP by the charge pump control circuit CP_CNTL. As a result, the frequency of the feedback signal CLK_FB approaches the frequency of the reference signal CLK_REF.

When the frequency of the feedback signal CLK_FB is made to conform to the frequency of the reference signal CLK_REF substantially, a frequency of outputting of the signal indicating that the frequencies differ to the outputs S_REF, S_FB of the frequency comparison circuit by the frequency comparison circuit lowers. Then, control based on the output S_PH of the phase comparison circuit PHASE_COMP becomes dominant in the control of the charge pump circuit CP by the charge pump control circuit CP_CNTL. And, immediately after transition to this state, phases of the feedback signal CLK_FB and the reference signal CLK_REF differ in many cases even if the frequencies thereof are substantially the same, a state in which one phase is earlier or later than the other phase continues for a long period of time and change in which the relation reverses is repeated from time to time. In this case, the output S_PF of the phase comparison circuit takes the same value for a long time and sometimes changes.

The steady state detection circuit CONV_DET is provided in the PLL circuit and outputs a level (high level (Vdd) or low level (Vss)) indicating that the steady state has not been reached to the output S_CONV of the steady state detection circuit when the output S_PH of the phase comparison circuit takes the same value for a predetermined time (for example, a time corresponding to four cycles of the reference signal CLK_REF) or longer. Based on this signal, the digital control circuit DIG_CNTL changes all of three bits of the digital control signal S_DG outputted therefrom according to the output S_PH of the phase comparison circuit PHASE_COMP.

Then, the oscillation frequency of the voltage controlled oscillator circuit VCO greatly changes according to the digital control signal S_DG of three bits. And, the charge pump control circuit CP_CNTL outputs a signal slightly changing the analog control signal S_AG to the control signal S_UL or the control signal S_DL according to the output S_PH of the phase comparison circuit PHASE_COMP, but when the output S_CONV of the steady state detection circuit is indicating that the steady state has not been reached, the above signal is outputted only once for every predetermined number of cycles (for example, eight cycles) of the inverted reference signal CLKB_REF, and in other cycles, neither signal is outputted.

Accordingly, the analog control signal S_AG changes only once for every predetermined number of cycles of the inverted reference signal CLKB_REF, and as a result, changes gradually. That is, a state in which a control width of the oscillation frequency by the digital control signal S_DG is large and the control of the oscillation frequency by the analog control signal S_AG is performed only gradually is obtained. This is a state in which phase jitter becomes large but the analog control signal S_AG easily converges.

Also in this case, the output S_PH of the phase comparison circuit changes from time to time, and immediately thereafter, the steady state detection circuit CONV_DET outputs a level indicating that the steady state has been reached to the output S_CONV of the steady state detection circuit. However, after a predetermined time elapsed, the output S_CONV of the steady state detection circuit becomes a level indicating the steady state has not been reached again. When the analog control signal S_AG converges, a frequency of change of the output S_PH of the phase comparison circuit increases, and a frequency of that the output S_CONV of the steady state detection circuit indicates that the steady state has been reached increases. And, when the output S_PH of the phase comparison circuit is made to change surely within the predetermined time, the steady state detection circuit CONV_DET continuously outputs a level indicating that the steady state has been reached to the output S_CONV of the steady state detection circuit.

When the output S_CONV of the steady state detection circuit is indicating that the steady state has been reached, the digital control circuit DIG_CNTL changes only one bit of the digital control signal S_DG according to the output S_PH of the phase comparison circuit PHASE_COMP, and fixes one of remaining bits to a high level and the other to a low level. Then, the oscillation frequency of the voltage controlled oscillator circuit VCO slightly changes according to the one bit of the digital control signal S_DG. And, the charge pump control circuit CP_CNTL outputs a signal slightly changing the analog control signal S_AG to the control signal S_UL or the control signal S_DL for every cycle according to the output S_PH of the phase comparison circuit PHASE_COMP.

Thereby, the analog control signal S_AG changes in a manner reflecting all of the output S_PH of the phase comparison circuit PHASE_COMP. However, in this time, since the output S_PH of the phase comparison circuit frequently changes, both of the control signal S_UL slightly increasing the analog control signal S_AG and the control signal S_DL slightly reducing the analog control signal S_AG are frequently outputted and the signals cancel each other, and therefore, the analog control signal S_AG does not drastically change. That is, phase jitter becomes small since the control width of the oscillation frequency by the digital control signal S_DG is small, the analog control signal S_AG does not drastically change, and therefore, a stable state is reached. This state is maintained thereafter.

A specific configuration example for each block configuring the PLL circuit shown in FIG. 1 is described in order.

Figure 2:
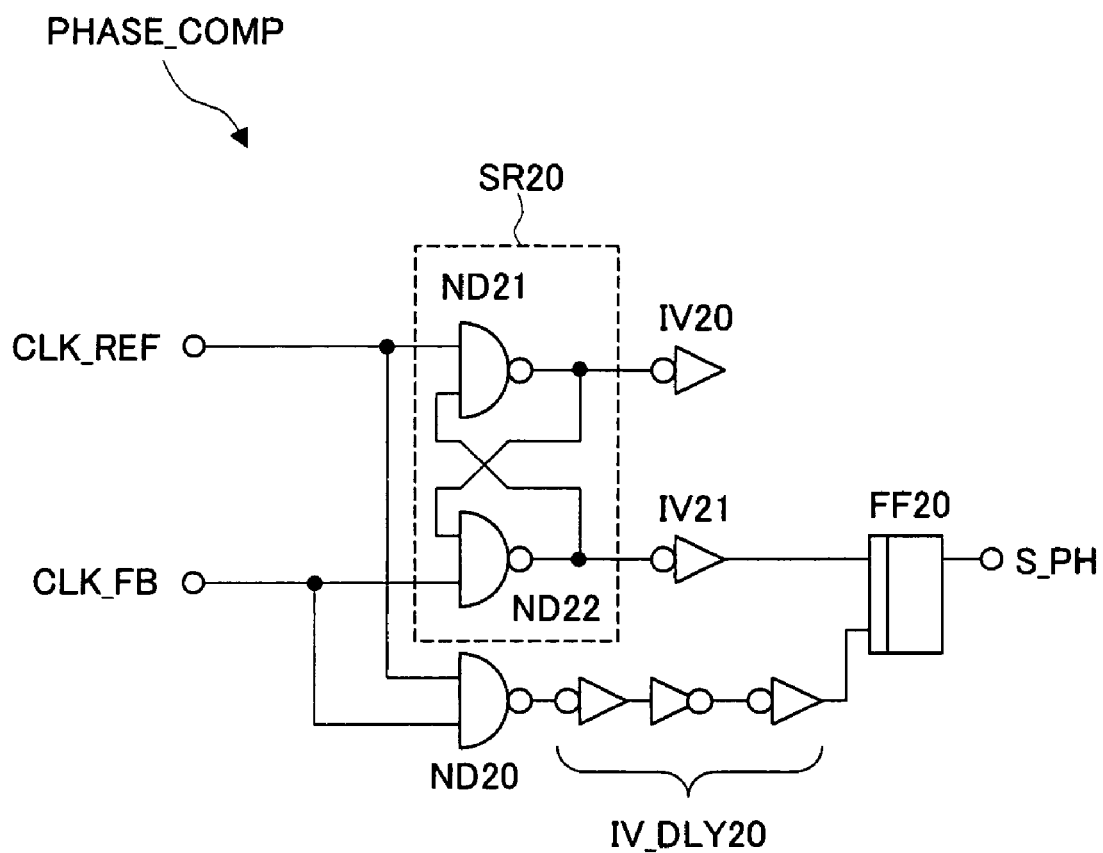
FIG. 2 is a circuit diagram showing a detailed configuration example of a phase comparison circuit in the PLL circuit of FIG. 1.

FIG. 2 is a circuit diagram showing a detailed configuration example of the phase comparison circuit PHASE_COMP in the PLL circuit of FIG. 1.

The phase comparison circuit PHASE_COMP shown in FIG. 2 is composed of a set-reset latch circuit SR20, a NAND circuit ND20, a delay circuit IV_DLY20, inverter circuits IV20 and IV21, and a flip-flop circuit FF20.

The set-reset latch circuit SR20 is composed of two NAND circuits ND21, ND22, and the reference signal CLK_REF is inputted to one input node of the NAND circuit ND21 and the feedback signal CLK_FB is inputted to one input node of the ND22. And, the output node of the NAND circuit ND22 is connected to the other input node of the ND21, and the output node of the NAND circuit ND21 is connected to the other input node of the NAND circuit ND22.

In the NAND circuit ND20, the reference signal CLK_REF is inputted to one node and the feedback signal CLK_FB is inputted to the other node. An output of the NAND circuit ND20 is used for clock trigger of the flip-flop circuit FF20 via the delay circuit IV_DLY20 composed of an inverter circuit of three stages in this example. To a data input node of the flip-flop circuit FF20, the output node of the NAND circuit ND22 is connected via the inverter circuit IV21. Note that, the inverter circuit IV20 connected to the output node of the NAND circuit ND21 is provided to equalize balance with a load with respect to the output of the ND22.

The phase comparison circuit PHASE_COMP detects which of a rising edge of the reference signal CLK_REF and a rising edge of the feedback signal CLK_FB appears first in the set-reset latch circuit SR20, takes in and holds a detection result thereof in the flip-flop circuit FF20 and outputs the output S_PH of the phase comparison circuit as a digital signal indicating the comparison result.

Figure 3:
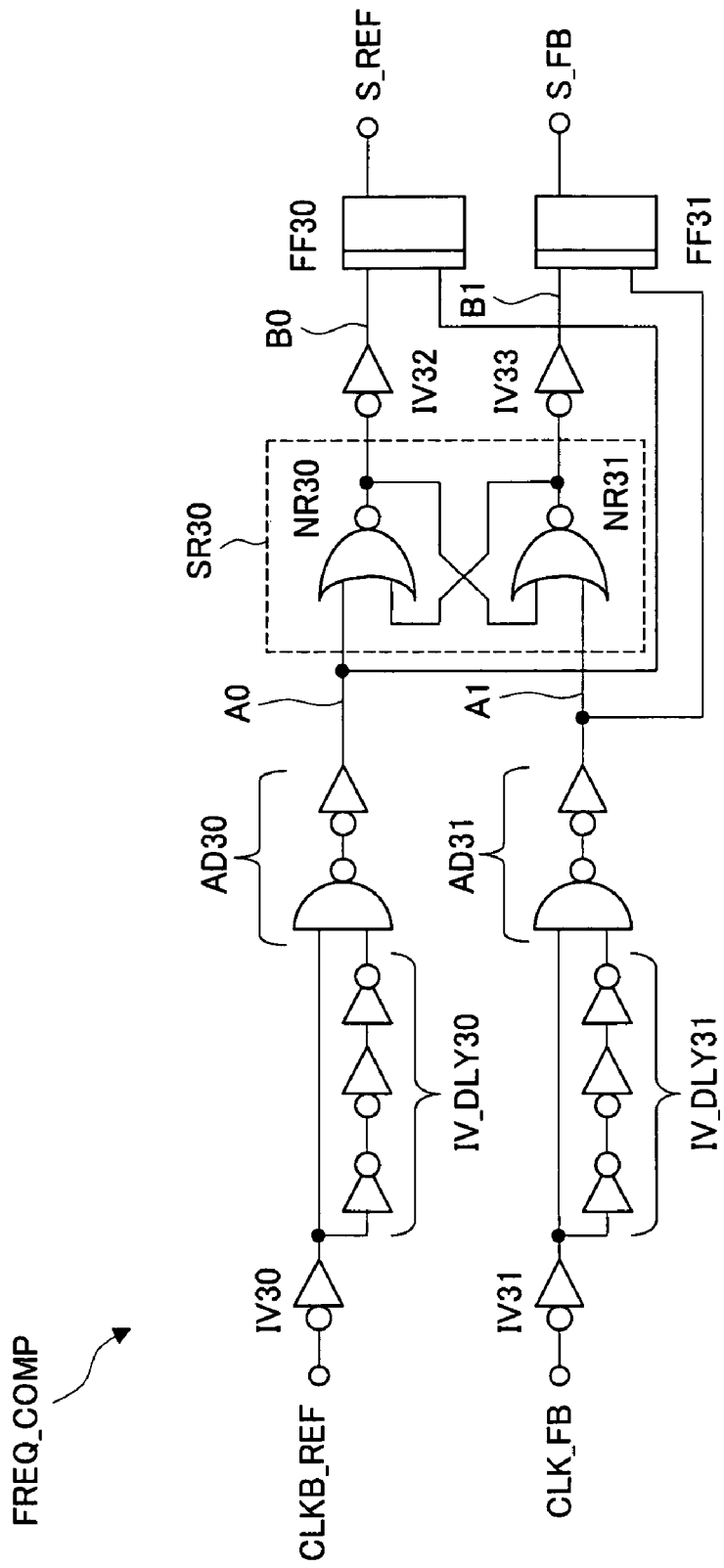
FIG. 3 is a circuit diagram showing a detailed configuration example of a frequency comparison circuit in the PLL circuit of FIG. 1.

FIG. 3 is a circuit diagram showing a detailed configuration example of the frequency comparison circuit FREQ_COMP in the PLL circuit of FIG. 1.

The frequency comparison circuit FREQ_COMP shown in FIG. 3 is composed of inverter circuits IV30, IV31, delay circuits IV_DLY30, IV_DLY31, AND circuits AD30, AD31, a set-reset latch circuit SR30, inverter circuits IV32, IV33, and flip-flop circuits FF30, FF31. The set-reset latch circuit SR30 is composed of two NOR circuits NR30, NR31, an output signal A0 of the AND circuit AD30 is inputted to one input node of the NOR circuit NR30 and an output signal A1 of the AND circuit AD31 is inputted to one input node of the NOR circuit NR31. And, an output node of the NOR circuit NR31 is connected to the other input node of the NOR circuit NR30 and an output node of the NOR circuit NR30 is connected to the other input node of the NOR circuit NR31.

The inverted reference signal CLKB_REF is inputted to the inverter circuit IV30, and an output thereof is connected to one input node of the AND circuit AD30 and an input node of the delay circuit IV_DLY30. And, an output of the delay circuit IV_DLY30 is connected to the other input node of the AND circuit AD30. According to this configuration, a pulse synchronized with a falling edge of the inverted reference signal CLKB_REF is outputted to the output A0 of the AND circuit AD30. Similarly, the feedback signal CLK_FB is inputted to the inverter circuit IV31, and an output thereof is connected to one input node of the AND circuit AD31 and an input node of the delay circuit IV_DLY31. And, an output of the delay circuit IV_DLY31 is connected to the other input node of the AND circuit AD31. According to this configuration, a pulse synchronized with a falling edge of the feedback signal CLK_FB is outputted to the output A1 of the AND circuit AD31.

Since the output A0 and the output A1 are inputted to the set-reset latch circuit SR30, after both pulses outputted to the output A0 and the output A1 disappeared, which pulse of the output A0 and the output A1 disappeared first is stored in the set-reset latch circuit SR30. And, the information is inputted to data input terminals B0 and B1 of the flip-flop circuit FF30 and the flip-flop circuit FF31 via the inverter circuit IV32 and the inverter circuit IV33.

Then, in a case where a next pulse appears on a side in which the pulse disappeared first, the flip-flop circuit FF30 or the flip-flop circuit FF31 outputs a low level to the output S_REF or S_FB of the frequency comparison circuit, and it can be recognized that the pulse appears alternately at the output A0 and the output A1. In a case where the next pulse appears on a side in which the pulse disappeared later, the flip-flop circuit FF30 or the flip-flop circuit FF31 outputs a high level to the output S_REF or S_FB of the frequency comparison circuit, and it can be recognized that the pulse on the side appeared continuously for two or more times.

Since the inverted reference signal CLKB_REF is a signal obtained by inverting the reference signal CLK_REF, this frequency comparison circuit FREQ_COMP detects whether the rising edge of the reference signal CLK_REF and the falling edge of the feedback signal CLK_FB appear alternately. And, in a case of alternately appearing, low levels are outputted to the output S_REF and S_FB of the frequency comparison circuit which is digital signals indicating a detection result thereof, and in a case where one of the edges appears continuously for two or more times, a high level is outputted to the output S_REF or S_FB of the frequency comparison circuit on the side.

Note that, in the steady state, the PLL circuit of FIG. 1 performs control so that the frequencies and the phases of the reference signal CLK_REF and the feedback signal CLK_FB are almost conformed and the rising edges thereof are at substantially the same time, and therefore, the rising edge of the reference signal CLK_REF and the falling edge of the feedback signal CLK_FB alternately appear and low levels are constantly outputted to the output S_REF and S_FB of the frequency comparison circuit.

In the PLL circuit of FIG. 1, the phase reverse detection circuit REV_DET is a circuit provided to detect that phase difference of the reference signal CLK_REF and the feedback signal CLK_FB is half-rotated after the frequency comparison circuit FREQ_COMP outputs a high level to the output S_REF or S_FB of the frequency comparison circuit, and phase relationship is reversed. This circuit is a circuit having the same configuration as the frequency comparison circuit other than that the feedback signal CLK_FB is inverted and inputted, and detects whether the rising edges of the reference signal CLK_REF and the feedback signal CLK_FB appear alternately. In a case of alternately appearing, the circuit operates as a circuit outputting low levels to the output S_REV1 and S_REV2 of the phase reverse detection circuit, and in a case where one of the edges appears continuously for two or more times, the circuit operates as a circuit outputting a high level to the output S_REV1 or S_REV2 of the phase reverse detection circuit.

When frequencies of the reference signal CLK_REF and the feedback signal CLK_FB become close, change of phase difference with respect to the feedback signal CLK_FB for one cycle of the reference signal CLK_REF becomes small. Here, if either one of the rising edge of the reference signal CLK_REF and the falling edge of the feedback signal CLK_FB appears continuously for two times, the phase differs by approximately half-period, and a state in which a phase on a side of a high frequency is delayed is maintained for a while thereafter. If the charge pump circuit CP is controlled based on the output S_PH of the phase comparison circuit PHASE_COMP in this state, control opposite to desired one is performed. A first object of providing the phase reverse detection circuit REV_DET is to avoid this situation. If either one of the rising edges of the reference signal CLK_REF and the feedback signal CLK_FB appeared continuously for two times, the phases are almost conformed, and thereafter, a state in which the phase on the side of a high frequency is advanced is maintained until either one of the rising edge of the reference signal CLK_REF and the falling edge of the feedback signal CLK_FB appears continuously for two times in next. If the charge pump circuit CP is controlled based on the output S_PH of the phase comparison circuit PHASE_COMP in this state, desired control is performed. Therefore, after one of the outputs of the frequency comparison circuit FREQ_COMP becomes a high level, the control of the charge pump circuit CP based on the output S_PH of the phase comparison circuit PHASE_COMP may be stopped, and may be resumed after one of the outputs of the phase reverse detection circuit REV_DET becomes a high level.

And, when the frequencies of the reference signal CLK_REF and the feedback signal CLK_FB become further closer, the change in phase difference with respect to the feedback signal CLK_FB for one cycle of the reference signal CLK_REF becomes further smaller, and false detection in which the frequency comparison circuit FREQ_COMP outputs a high level to the output S_REF or S_FB of the frequency comparison circuit even when each edge alternately appear may occur. A second object of providing the phase reverse detection circuit REV_DET is to prevent influence of this false detection. This false detection occurs when the rising edge of the reference signal CLK_REF and the falling edge of the feedback signal CLK_FB appear at substantially the same time, and occurs continuously over a few cycles before and after the one cycle in which right detection is performed. False detection appearing in a first cycle thereof outputs a signal same as the right detection as a result, because a signal on a side of a high frequency appears later. And, between occurrence of false detection in a series of cycles sandwiching right detection of one cycle and occurrence of next false detection in a series of cycles sandwiching right detection of one cycle, the phase difference of the reference signal CLK_REF and the feedback signal CLK_FB rotates once. At a time of about half-rotation thereof, the phase reverse detection circuit REV_DET outputs a high level to the output S_REV1 or S_REV2 of the phase reverse detection circuit. Therefore, after controlling the charge pump circuit CP based on the output S_REF or S_FB of the frequency comparison circuit FREQ_COMP, the control of the charge pump circuit CP based on the output of the frequency comparison circuit FREQ_COMP is not performed until the phase reverse detection circuit REV_DET outputs a high level to either one of the output S_REV1 or S_REV2 of the phase reverse detection circuit. Accordingly, influence of false detection of the frequency comparison circuit FREQ_COMP can be avoided.

Figure 4:
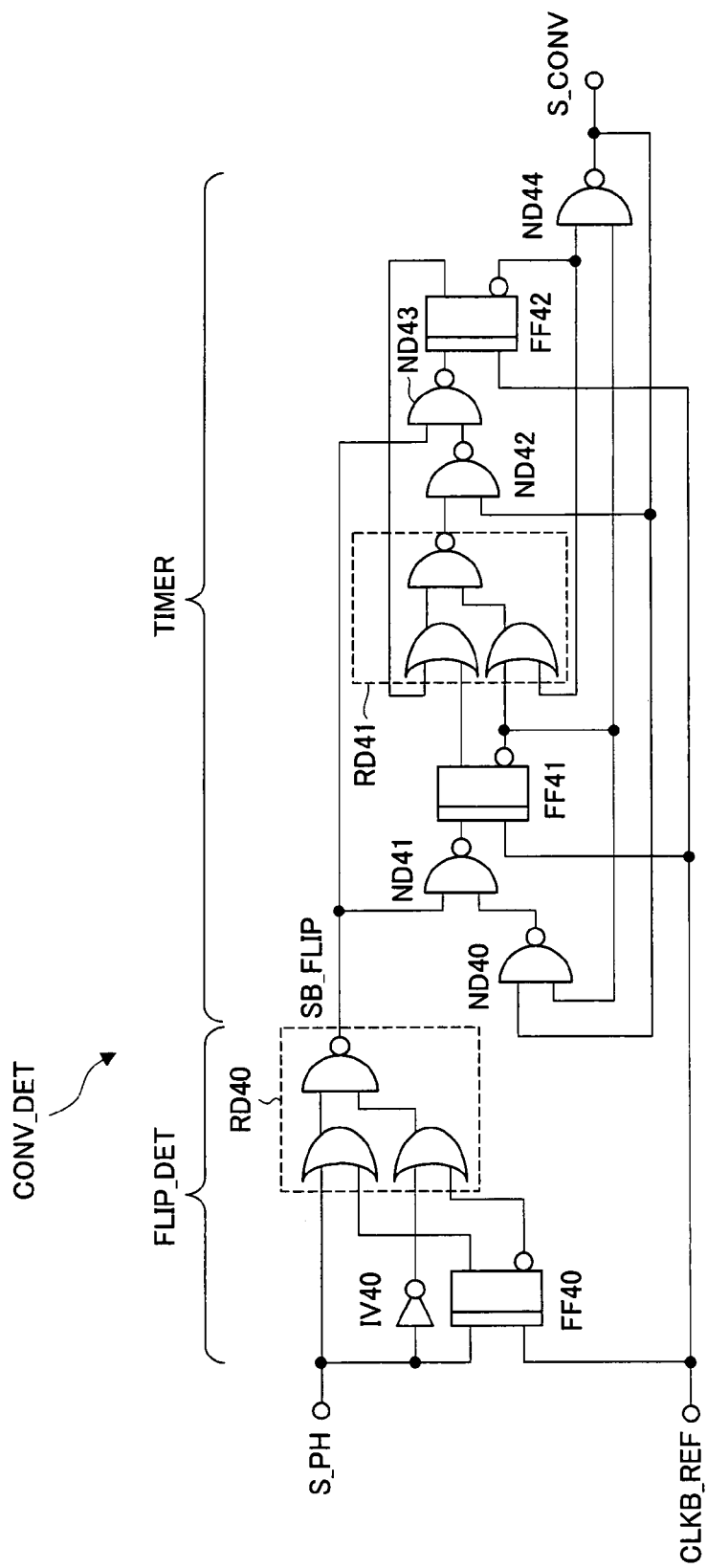
FIG. 4 is a circuit diagram showing a detailed configuration example of a steady state detection circuit in the PLL circuit of FIG. 1.

FIG. 4 is a circuit diagram showing a detailed configuration example of the steady state detection circuit CONV_DET in the PLL circuit of FIG. 1

The steady state detection circuit shown in FIG. 4 is composed of a portion FLIP_DET detecting that the output S_PH of the phase comparison circuit is inverted and a portion TIMER measuring elapsed time from inversion of the output S_PH of the phase comparison circuit and detecting that a predetermined time elapsed. Each portion is composed of an inverter circuit IV40, flip-flop circuits FF40 to FF42, OR-NAND compound circuits RD40, RD41 and NAND circuits ND40 to ND44. The flip-flop circuit FF40 stores the output S_PH of the phase comparison circuit of one cycle before, and the portion FLIP_DET detecting occurrence of inversion compares the current output S_PH of the phase comparison circuit and the output S_PH of the phase comparison circuit of one cycle before. If they are different, determination that the output S_PH of the phase comparison circuit is inverted is made, and a signal indicating that is outputted to a signal SB_FLIP.

In the circuit shown in FIG. 4, the signal SB_FLIP becomes a low level when the output S_PH of the phase comparison circuit is inverted, and becomes a high level when it is not inverted. The portion TIMER detecting that a predetermined time elapsed is composed of a two bit counter configured by flip-flop circuits FF41, FF42 and the like. The two bit counter counts the number of pulses of the inverted reference signal CLKB_REF, but if the signal SB_FLIP becomes a low level, a count value is reset to zero in the next cycle. While the signal SB_FLIP is a high level, the count value advances by one count, and when the count value reaches three, a low level is outputted to the output S_CONV of the steady state detection circuit and the count value is fixed to the count value. That is, this steady state detection circuit CONV_DET operates as a circuit outputting a low level to the output S_CONV of the steady state detection circuit when the output S_PH of the phase comparison circuit is not inverted for four or more cycles and outputting a high level to the output S_CONV of the steady state detection circuit when the output S_PH of the phase comparison circuit is inverted within three cycles.

Figure 5:
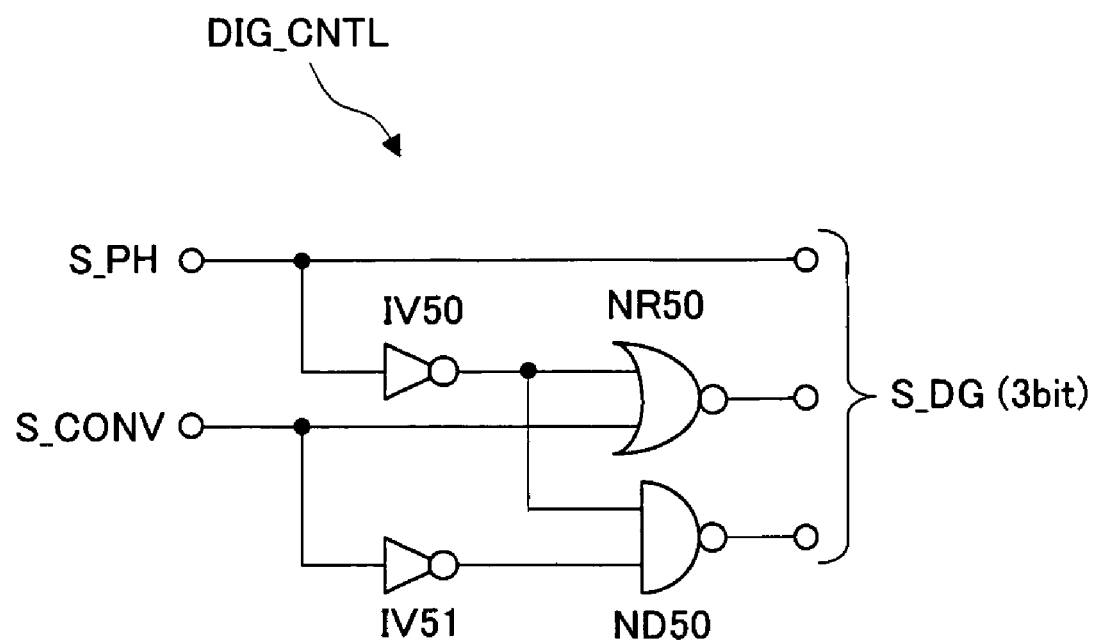
FIG. 5 is a circuit diagram showing a detailed configuration example of a digital control circuit in the PLL circuit of FIG. 1.

FIG. 5 is a circuit diagram showing a detailed configuration example of the digital control circuit DIG_CNTL in the PLL circuit of FIG. 1.

The digital control circuit shown in FIG. 5 is composed of inverter circuits IV50, IV51, a NAND circuit ND50 and a NOR circuit NR50. In the circuit shown in FIG. 5, a level same as the output S_PH of the phase comparison circuit is outputted to all of three bits of the digital control signal S_DG when the output S_CONV of the steady state detection circuit is a low level, and a level same as the output S_PH of the phase comparison circuit is outputted to only one bit of the digital control signal and a low level and a high level is outputted to the other two bits of the digital control signal S_DG respectively when the output S_CONV of the steady state detection circuit is a high level.

Figure 6:
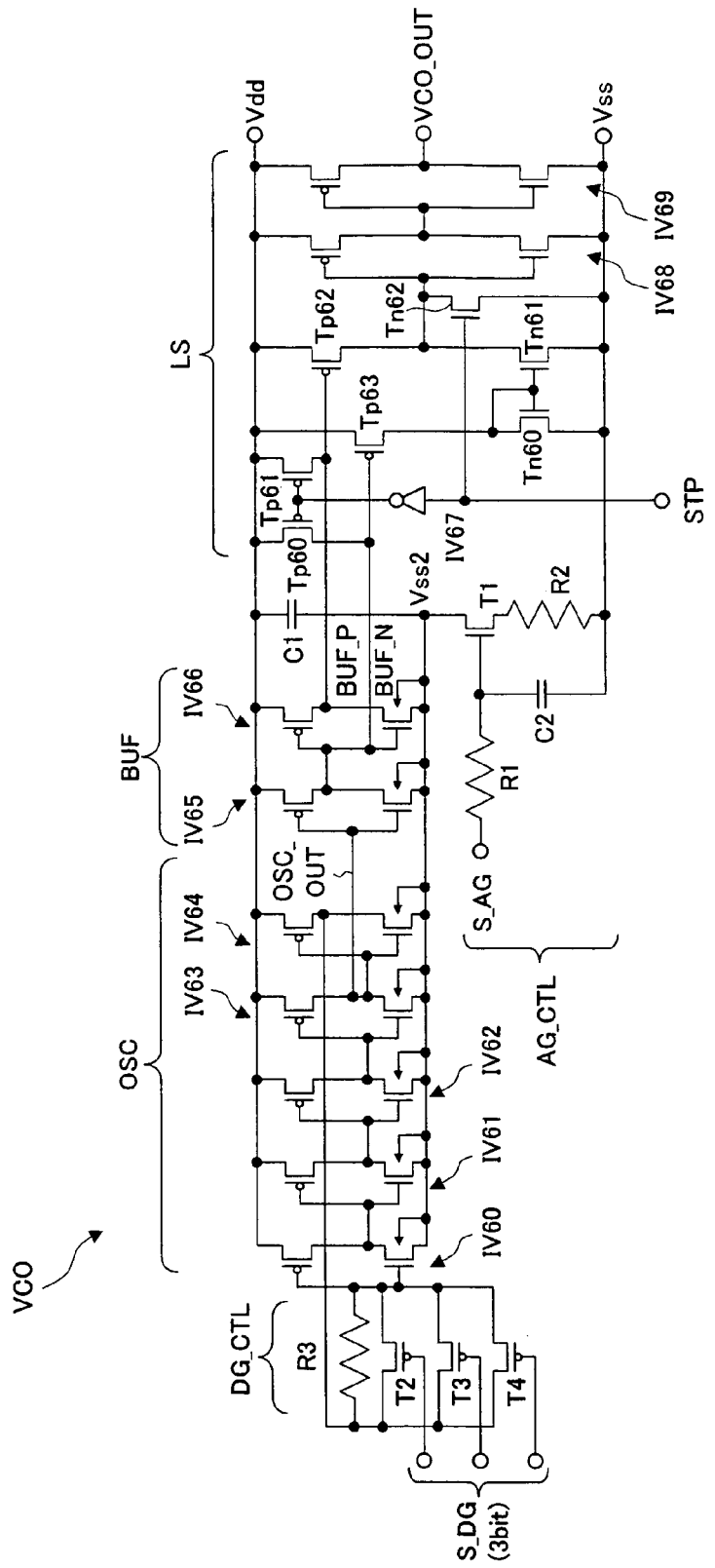
FIG. 6 is a circuit diagram showing a detailed configuration example of a voltage controlled oscillator circuit in the PLL circuit of FIG. 1.

FIG. 6 is a circuit diagram showing a detailed configuration example of the voltage controlled oscillator circuit VCO in the PLL circuit of FIG. 1.

Figure 14:
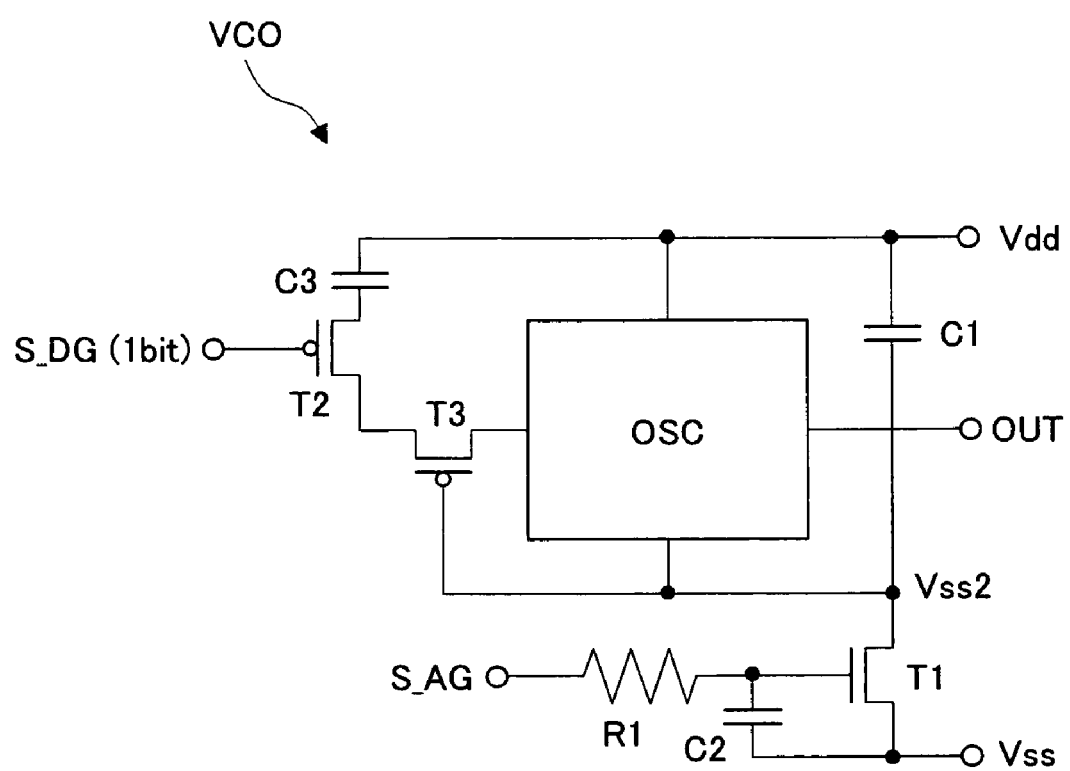
FIG. 14 is a circuit diagram showing a schematic configuration example of a voltage controlled oscillator circuit included in a PLL circuit examined as a premise of the present invention.

The voltage controlled oscillator circuit of FIG. 6 shows a more detailed configuration example of the voltage controlled oscillator circuit VCO shown in FIG. 14, and is composed of a digital control unit DG_CTL, a ring oscillator circuit OSC, a buffer circuit BUF, a level shift circuit LS and an analog control unit AG_CTL. The ring oscillator circuit OSC is composed of CMOS inverter circuits IV60 to IV64 of odd stages (five stages herein) connected between the high potential side power source node Vdd and the second low potential side power source node Vss2. An output node of the IV64 of a fifth stage is fed back to an input node of the IV60 of a first stage via the resistor R3, and oscillating operation is performed by this ring configuration.

Unlike the circuit of a known example described in FIG. 14, the digital control unit DG_CTL of the circuit of FIG. 6 is composed of PMOS transistors T2 to T4 each having a gate electrode connected to each bit of the digital control signal S_DG and provided in parallel with the resistor R3. When all the PMOS transistors T2 to T4 are in a cut-off state, the output node of the inverter circuit IV64 and the input node of the inverter circuit IV60 are connected by a resistance value of only the resistor R3, but when some of the PMOS transistors T2 to T4 transit to a conductive state, values corresponding to resistance values of the PMOS transistors are connected in parallel, a resistance value of the feedback circuit reduces and the oscillation frequency increases. An amount of change of the oscillation frequency caused by this is the control width by the digital control signal S_DG.

In the circuit of the known example described in FIG. 14, it is difficult to make the control width of the oscillation frequency smaller than that in a case of designing the PMOS transistor T2 and the capacitance C3 at a minimum size that can be formed in the semiconductor technology, but in the circuit of FIG. 6, the control width of the oscillation frequency can be made small relatively easily by reducing the resistance value of the resistor R3.

In a case where each of three bits of the digital control signal S_DG changes simultaneously, a conductive state or a cut-off state of the PMOS transistors T2 to T4 are controlled simultaneously, and therefore, the control width of the oscillation frequency becomes large. In a case where only one bit of the digital control signal S_DG changes and the other bits are fixed to a low level and a high level respectively, control of the oscillation frequency is performed by an amount corresponding to one PMOS transistor, and therefore, the control width becomes small. If all the PMOS transistors T2 to T4 are designed to have the same size, the control width of the oscillation frequency in a case where only one bit of the digital control signal S_DG changes is about one third of that in a case where all three bits change. And, if design is carried out so that only one PMOS transistor connected to the control signal which changes when only one bit changes becomes small, the control width of the oscillation frequency in a case where only one bit changes is further reduced than one third in comparison with a case in which all three bits change.

The buffer circuit BUF is composed of, for example, CMOS inverter circuits IV65, IV66 of two stages connected between the high potential side power source node Vdd and the second low potential side power source node Vss2, and the output node OSC_OUT of the ring oscillator circuit OSC (output node of one of the inverter circuits IV60 to IV64) is connected to an input node of the inverter circuit IV65 of a first stage. The buffer circuit BUF is provided to reduce a load to an output node of the ring oscillator circuit OSC.

The level shift circuit LS is connected between the high potential side power source node Vdd and the first low potential side power source node Vss, and is composed of a differential amplifier circuit configured by PMOS transistors Tp62, Tp63 and NMOS transistors Tn60, Tn61 and CMOS inverter circuits IV68, IV69 of second stages connected to an output node thereof. The PMOS transistors Tp62, Tp63 operate as a differential pair, a gate of the PMOS transistor Tp62 is connected to an output node BUF_P of the inverter circuit IV66 in the buffer circuit BUF, and a gate of the PMOS transistor Tp63 is connected to an output node BUF_N of the inverter circuit IV65 in the buffer circuit BUF. The NMOS transistors Tn60 and Tn61 configure a current mirror circuit and connected to drains of the PMOS transistors Tp63 and Tp62 respectively so as to operate as a load current source of the differential amplifier circuit. And, the drain of the PMOS transistor Tp62 is connected to an input node of the CMOS inverter circuit IV68 of a first stage and an oscillation output signal VCO_OUT is obtained from the CMOS inverter circuit IV69 of a second stage.

This level shift circuit LS is provided to convert an oscillation signal oscillating between the high potential side power source node Vdd and the second low potential side power source node Vss2 to an oscillation signal oscillating at an entire amplitude between the high potential side power source node Vdd and the first low potential power source node Vss. Note that, in addition to such configuration, the level shift circuit LS of FIG. 6 further includes PMOS transistors Tp60, Tp61, an NMOS transistor Tn62 and an inverter circuit IV67 for fixing an oscillation output signal VCO_OUT to a low level in response to a stop signal STP. When the stop signal STP becomes a high level, a low level is applied to gates of the PMOS transistors Tp60 and Tp61 via the inverter circuit IV67, and a voltage of the high potential side power source node Vdd is applied to gates of the PMOS transistors Tp63 and Tp62 via these turned-on PMOS transistors Tp60 and Tp61. Furthermore, the high level of the stop signal STP is also applied to a gate of the NMOS transistor Tn62, and an input node of the inverter circuit IV68 is fixed at a low level via this turned-on NMOS transistor Tn62.

The analog control unit AG_CTL has a configuration including a resistor R2 in addition to an NMOS transistor T1 and a low pass filter composed of a resistor R1 and capacitance C2 connected to a gate of the NMOS transistor T1 described in FIG. 14. The NMOS transistor T1 has a drain connected to the second low potential side power source node Vss2 and a source connected to the first low potential side power source node Vss via the resistor R2. And, the analog control signal S_AG is inputted to the gate of the NMOS transistor T1 via the low pass filter. Here, the resistor R2 is provided to suppress fluctuation of a current flowing to the NMOS transistor T1 when voltage fluctuation occurs between the second low potential side power source node Vss2 and the first low potential side power source node Vss.

Figure 7:
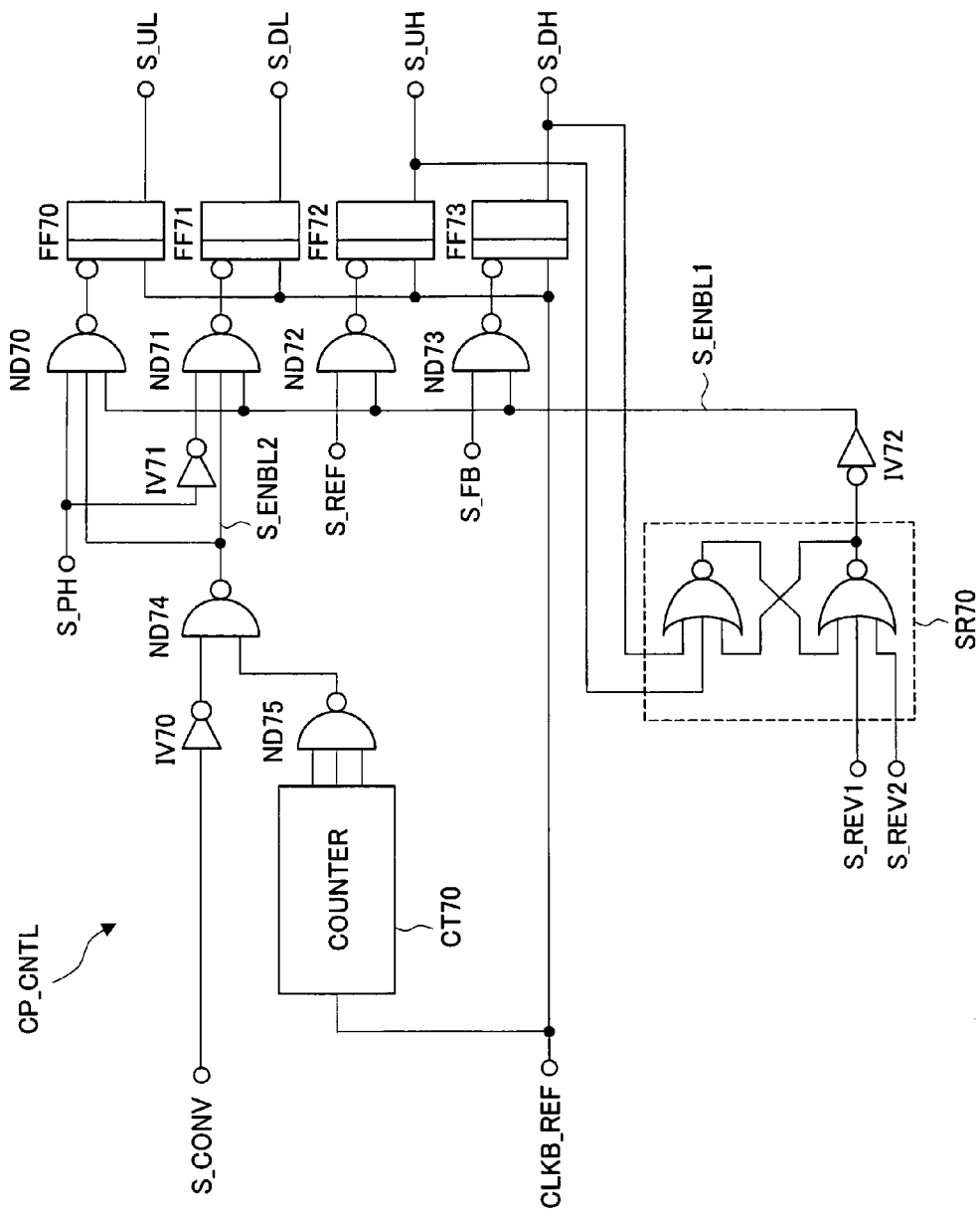
FIG. 7 is a circuit diagram showing a detailed configuration example of a charge pump control circuit in the PLL circuit of FIG. 1.

FIG. 7 is a circuit diagram showing a detailed configuration example of the charge pump control circuit CP_CNTL in the PLL circuit of FIG. 1. The charge pump control circuit shown in FIG. 7 is composed of a counter circuit CT70, inverter circuits IV70 to IV72, NAND circuits ND70 to ND75, flip-flop circuits FF70 to FF73 and a set-reset latch circuit SR70. The counter circuit CT70 is a circuit counting the number of pulses of the inverted reference signal CLKB_REF, and is a circuit which is reset to zero at a pulse next to a pulse achieving a maximum count value and further repeats count operation. Here, a case in which a three bit counter is used and is reset for every eight counts is explained as an example.

The set-reset latch circuit SR70 stores which of the control signal S_UH or S_DH greatly changing the oscillation frequency and the output S_REV1 or S_REV2 of the phase reverse detection circuit REV_DET is a high level for last. If the control signal S_UH or S_DH is a high level for last, a low level is outputted to an enable signal S_ENBL1 via the inverter circuit IV72. On the other hand, if the output S_REV1 or S_REV2 of the phase reverse detection circuit is a high level for last, a high level is outputted to the enable signal S_ENBL1. If both of the control signal S_UH or S_DH and the output S_REV1 or S_REV2 of the phase reverse detection circuit are still high levels, a high level is outputted to the enable signal S_ENBL1. If the frequency comparison circuit FREQ_COMP outputs a high level to the output S_REF or S_FB of the frequency comparison circuit while the enable signal S_ENBL1 is a high level, the charge pump control circuit CP_CNTL outputs a high level to the control signal S_UH or S_DH greatly changing the oscillation frequency in synchronization with next rising of the inverted reference signal CLKB_REF. And, if the output S_REV1 and S_REV2 of the phase reverse detection circuit are low levels at this time, the enable signal S_ENBL1 becomes a low level. When the enable signal S_ENBL1 is a low level, a low level is outputted to the control signal S_UH and S_DH in synchronization with next rising of the inverted reference signal CLKB_REF irrespective of the output of the frequency comparison circuit FREQ_COMP. Therefore, the circuit operates as a circuit that outputs a high level to the control signal S_UH or S_DH only with respect to a high level of the output S_REF or S_FB of the frequency comparison circuit which appears first after the output S_REV1 or S_REV2 of the phase reverse detection circuit becomes a high level, and thereafter, outputs a low level to the control signal S_UH and S_DH until the output S_REV1 or S_REV2 of the phase reverse detection circuit becomes a high level again.

And, since the counter circuit CT70 outputs all one for every eight counts, while the steady state detection circuit CONV_DET is outputting a low level to the output S_CONV of the steady state detection circuit, a high level is outputted to the enable signal S_ENBL2 only once for every eight cycles and a low level is outputted to the enable signal S_ENBL2 in other seven cycles. When the S_CONV is a high level, a high level is constantly outputted to the enable signal S_ENBL2. When both of the enable signals S_ENBL1 and S_ENBL2 are high levels, a high level is outputted to the control signal S_UL or S_DL slightly changing the oscillation frequency according to the output S_PH of the phase comparison circuit PHASE_COMP. When at least one of the enable signals S_ENBL1 and S_ENBL2 is a low level, low levels are outputted to both of the control signals S_UL and S_DL. That is, the circuit operates as a circuit which outputs low levels to both of the control signals S_UL and S_DL after either one of the outputs S_REF and S_FB of the frequency comparison circuit becomes a high level until either one of the outputs S_REV1 and S_REV2 of the phase reverse detection circuit becomes a high level, and after either one of the outputs S_REV1 and S_REV2 of the phase reverse detection circuit becomes a high level, outputs a high level to the control signal S_UL or S_DL according to the output S_PH of the phase comparison circuit, for every cycle if the output S_CONV of the steady state detection circuit is a high level and once every eight cycles if the output S_CONV of the steady state detection circuit is a low level.

Figure 8:
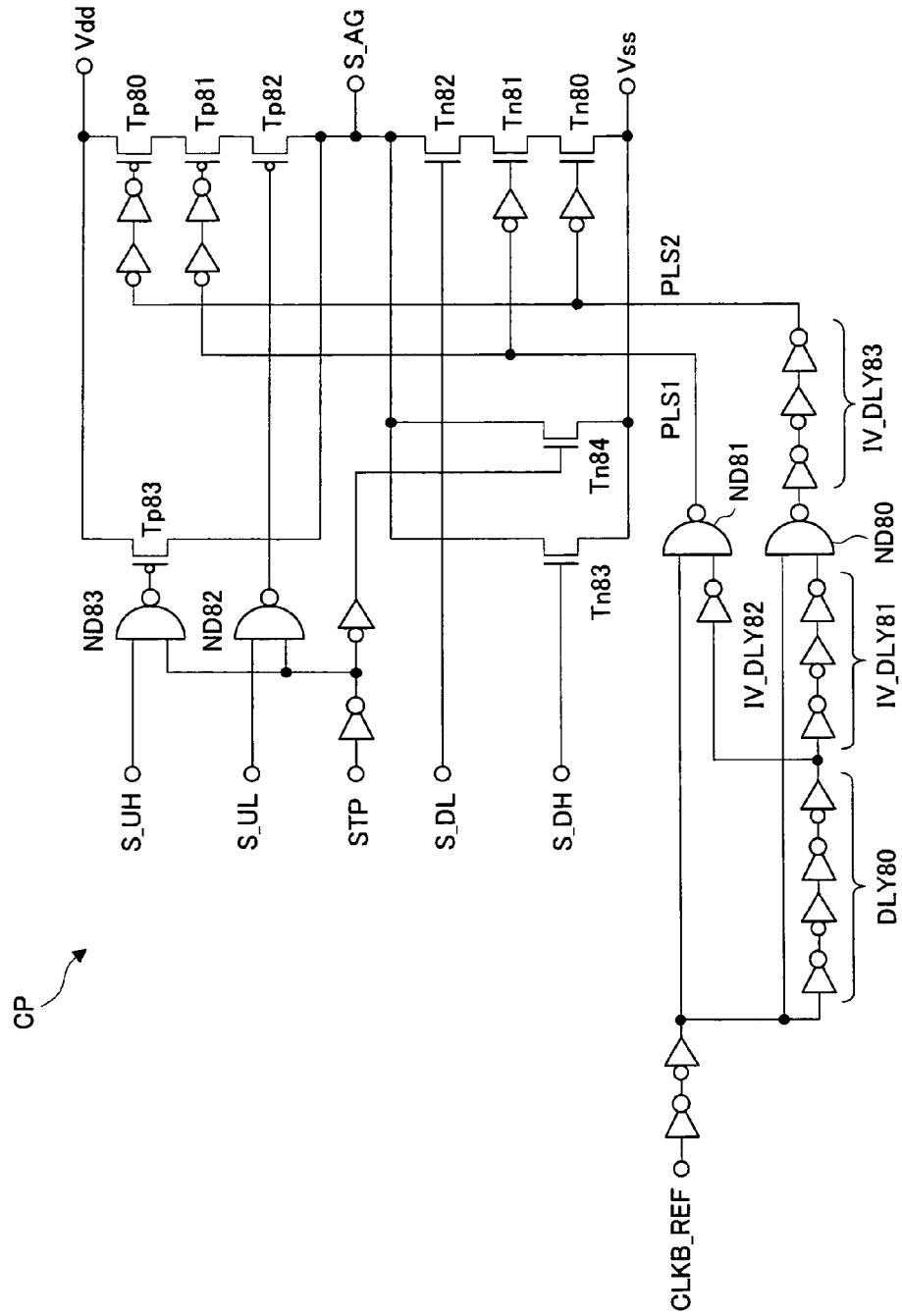
FIG. 8 is a circuit diagram showing a detailed configuration example of a charge pump circuit in the PLL circuit of FIG. 1.

FIG. 8 is a circuit diagram showing a detailed configuration example of the charge pump circuit CP in the PLL circuit of FIG. 1. The charge pump circuit of FIG. 8 comprises PMOS transistors Tp80 to Tp82 and NMOS transistors Tn82 to Tn80 between the high potential side power source node Vdd and the first low potential side power source node Vss. Here, the analog control signal S_AG is outputted from the output node corresponding to drains of the PMOS transistor Tp82 and the NMOS transistor Tn82.

And, a PMOS transistor Tp83 is connected in parallel with the PMOS transistors Tp80 to Tp82 between the output node of the analog control signal S_AG and the high potential side power source node Vdd, and two NMOS transistors Tn83, Tn84 are connected in parallel with the NMOS transistors Tn82 to Tn80 respectively between the output node of the analog control signal S_AG and the first low potential side power source node Vss. A first pulse signal PLS1 (and an inverted signal thereof) is inputted to a gate of the PMOS transistor Tp81 (and the NMOS transistor Tn81). On the other hand, a second pulse signal PLS2 (and an inverted signal thereof) is inputted to a gate of the PMOS transistor Tp80 (and the NMOS transistor Tn80).

The first pulse signal PLS1 is generated by operating the inverted reference signal CLKB_REF and a signal obtained by inverting and delaying the same by delay circuits DLY80 and IV_DLY82 configured by an inverter circuit of five stages in total in a NAND circuit ND81. In this case, the first pulse signal PLS1 becomes a low pulse signal having a pulse width corresponding to an inverter circuit of five stages. On the other hand, the second pulse signal PLS2 is generated by operating the inverted reference signal CLKB_REF and a signal obtained by inverting and delaying the same by delay circuits DLY80 and IV_DLY81 configured by an inverter circuit of seven stages in total in the NAND circuit ND80, and inverting and delaying an output thereof by a delay circuit IV_DLY83 configured by an inverter circuit of three stages. In this case, the second pulse signal PLS2 becomes a high pulse signal having a pulse width corresponding to an inverter circuit of seven stages, and becomes a pulse signal that rises after a delay time corresponding to the delay circuit IV_DLY83 from falling of the first pulse signal PLS1. That is, the delay time of the delay circuit IV_DLY83 becomes a time from conduction of the TP81 (and Tn81) to cut-off of the Tp80 (and Tn80), that is, a time of flowing a current between the high potential side power source node Vdd and the analog control signal S_AG or between the analog control signal S_AG and the first low potential side power source node Vss.

A result of operation of an inverted signal of the stop signal STP and the control signal S_UL in the NAND circuit ND82 is inputted to a gate of the PMOS transistor Tp82, and the control signal S_DL is inputted to a gate of the NMOS transistor Tn82. Therefore, the PMOS transistor Tp82 is turned ON when the control signal S_UL slightly increasing a frequency becomes a high level in a case where the stop signal STP is a low level (inactivated). On the other hand, the NMOS transistor Tn82 is turned ON when the control signal S_DL slightly reducing the frequency becomes a high level. And, when one of the PMOS transistor Tp82 and the NMOS transistor Tn82 is turned ON, a current having a very short time width corresponding to the delay time of the delay circuit IV_DLY83 is outputted to a terminal of the analog control signal S_AG.

A result of operation of an inverted signal of the stop signal STP and the control signal S_UH in the NAND circuit ND83 is inputted to a gate of the PMOS transistor Tp83, and the control signal S_DH is inputted to a gate of the NMOS transistor Tn83. Therefore, the PMOS transistor Tp83 is turned ON when the control signal S_UH greatly increasing the frequency becomes a high level in a case where the stop signal STP is a low level (inactivated). On the other hand, the NMOS transistor Tn83 is turned ON when the control signal S_DH greatly reducing the frequency becomes a high level. When the PMOS transistor Tp83 or the NMOS transistor Tn83 is conductive, a current having a time width corresponding to a pulse width of the control signal S_UH or S_DH (that is, corresponding to one cycle of the reference signal CLK_REF) is outputted to the terminal of the analog control signal S_AG. Since this time is considerably longer than the delay time of the delay circuit IV_DLY83, the control width by the control signal S_UH or S_DH becomes considerably larger than the control width by the control signal S_UL or S_DL.

Note that, the stop signal STP is provided to set the analog control signal S_AG to the first low potential side power source node Vss voltage and stop oscillation of the voltage controlled oscillator circuit VCO in test, for example. When the stop signal STP becomes a high level, the PMOS transistors Tp82 and Tp83 are driven to OFF via the NAND circuits ND82 and ND83, and the NMOS transistor Tn84 is driven to ON so that the analog control signal S_AG is connected to the Vss.

As described above, by using the PLL circuit of the first embodiment, the control width of the oscillation frequency by the digital control signal in the steady state can be suppressed and the PLL circuit having small phase jitter can be realized.

Second Embodiment

In the first embodiment described above, a configuration in which the charge pump circuit CP and the voltage controlled oscillator circuit VCO are connected by one analog control signal S_AG is described. In a second embodiment, a configuration in which connection therebetween is made by two analog control signals S_AG1 and S_AG2 is described.

Figure 9:
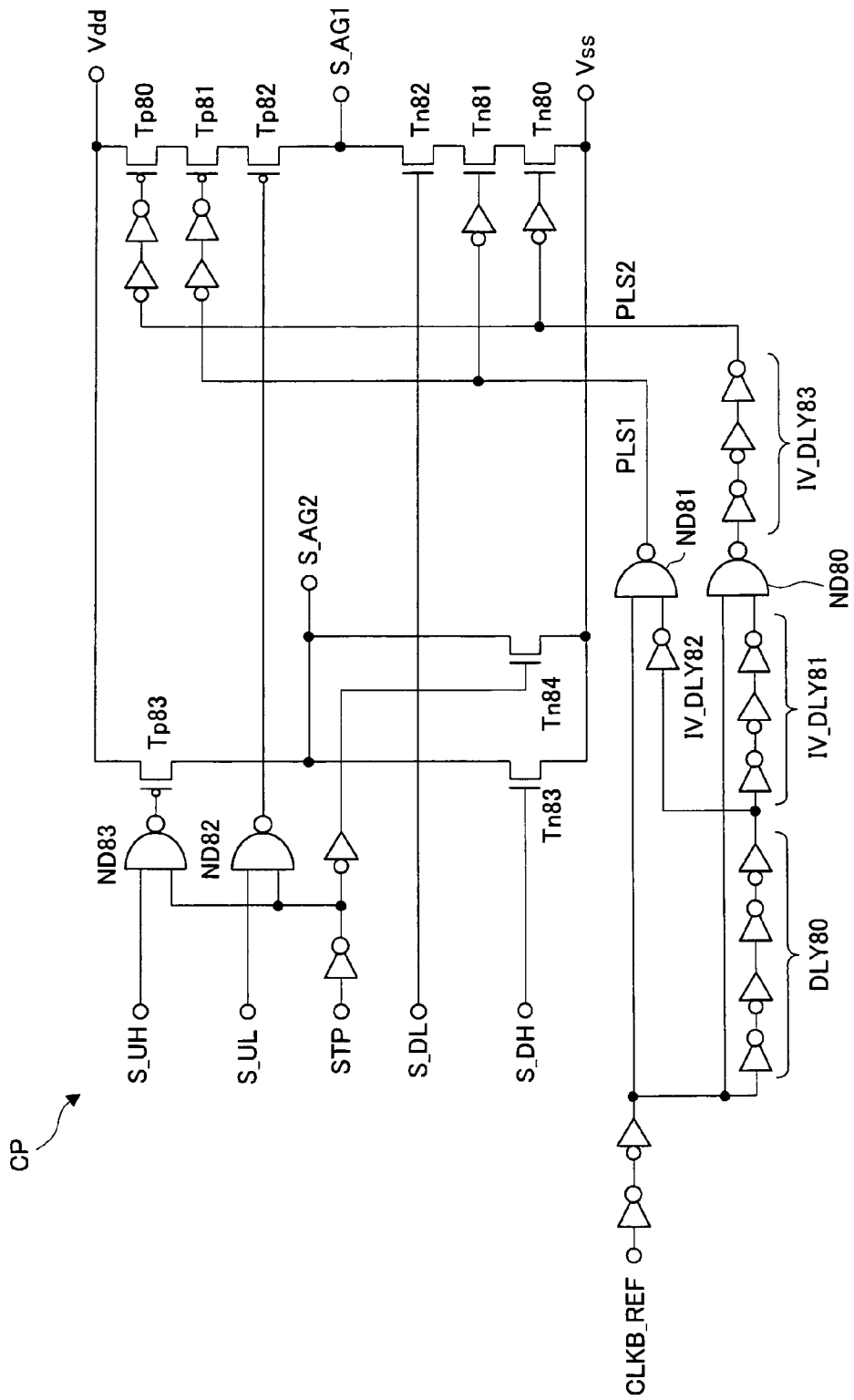
FIG. 9 is a circuit diagram showing a detailed configuration example of a charge pump circuit in a PLL circuit according to a second embodiment of the present invention.

FIG. 9 is a circuit diagram showing a configuration example of a charge pump circuit CP according to the second embodiment of the present invention. The charge pump circuit shown in FIG. 9 employs a configuration in which the analog control signal S_AG1 outputted from a circuit configured by the PMOS transistors Tp80 to Tp82 and the NMOS transistors Tn82 to Tn80 is separated from an analog control signal S_AG2 outputted from the other circuits, in comparison with the charge pump circuit shown in FIG. 8. An object thereof is to reduce parasitic capacitance generated at the node of the analog control signal S_AG1, as much as possible.

In the case of FIG. 8, if an amount of charges charged/discharged to the capacitance C2 via the resistor R1 of FIG. 6 through the PMOS transistors Tp80 to Tp82 or the NMOS transistors Tn82 to Tn80 is sufficiently larger than an amount of charges charged/discharged to the parasitic capacitance generated at the node of the analog control signal S_AG, the parasitic capacitance can be ignored. However, if time of current flowing is shortened to reduce the amount of the charges charged/discharged to the capacitance C2, the parasitic capacitance cannot be ignored. FIG. 9 shows a configuration for avoiding this, and circuits other than the PMOS transistors Tp80 to Tp82 and the NMOS transistors Tn82 to Tn80 is separated to reduce the parasitic capacity generated at the analog control signal S_AG1 as much as possible in this configuration.

Figure 10:
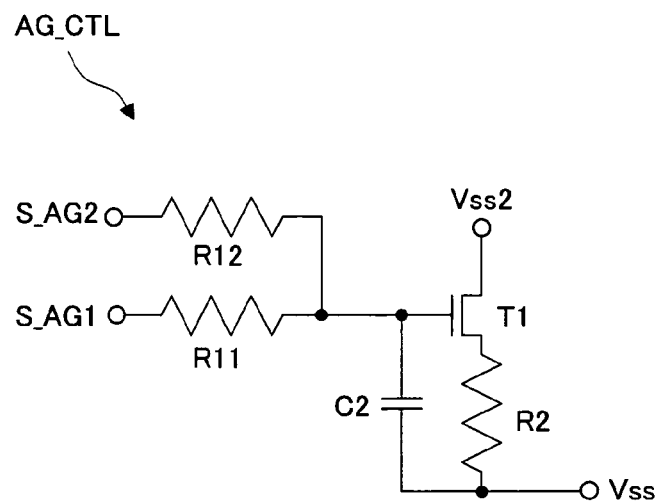
FIG. 10 is a circuit diagram showing a detailed configuration example of an analog control unit in a voltage controlled oscillator circuit in the PLL circuit according to the second embodiment of the present invention.

FIG. 10 is a circuit diagram showing a configuration example of the analog control unit AG_CTL in the voltage controlled oscillator circuit VCO used with the charge pump circuit shown in FIG. 9. In this circuit, separate resistors R11 and R12 are provided between the analog control signals S_AG1 and S_AG2 and the capacitance C2, and the analog control signals S_AG1 and S_AG2 are separated. Other portions in the analog control unit AG_CTL and a portion other than the analog control unit in the voltage controlled oscillator circuit VCO have the same configuration as the voltage controlled oscillator circuit shown in FIG. 6. Charges charged/discharged through the analog control signal S_AG1 and charges charged/discharged through the analog control signal S_AG2 are both stored in the capacitance C2, and operate similar to the voltage controlled oscillator circuit shown in FIG. 6. By separating the analog control signal S_AG1 and the analog control signal S_AG2, the parasitic capacitance generated at the node of the analog control signal S_AG2 can be prevented from influencing the circuit providing the analog control signal S_AG1.

Third Embodiment

In the first embodiment described above, a case in which the buffer circuit BUF in the voltage controlled oscillator circuit VCO is configured by an inverter of two stages is described. In a third embodiment, a case in which the buffer circuit BUF is configured by an inverter of four stages is described.

Figure 11:
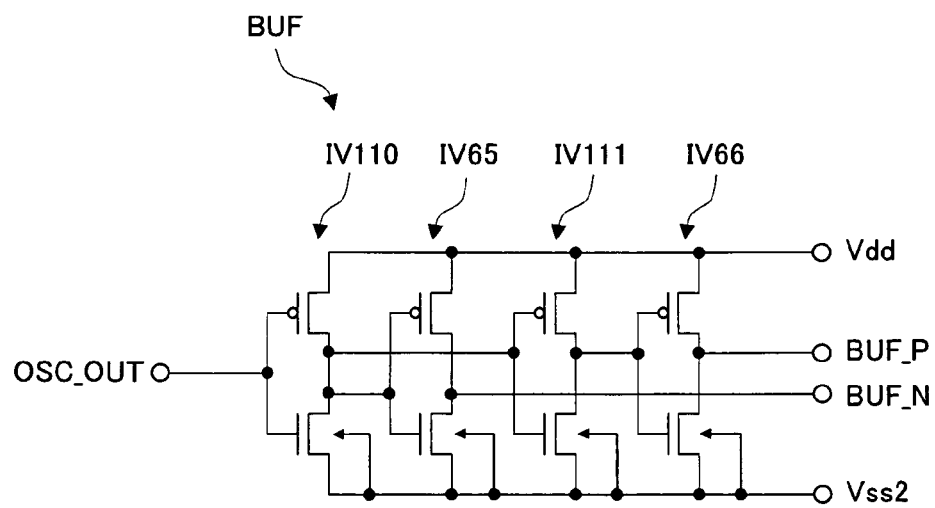
FIG. 11 is a circuit diagram showing a detailed configuration example of a buffer circuit in a voltage controlled oscillator circuit in a PLL circuit according to a third embodiment of the present invention.

FIG. 11 is a circuit diagram showing a configuration example of the buffer circuit BUF in the voltage controlled oscillator circuit VCO according to the third embodiment of the present invention. This buffer circuit is configured by inverter circuits IV110, IV65, IV111 and IV66. In comparison with the buffer circuit in the voltage controlled oscillator circuit shown in FIG. 6, in this circuit, an input signal of the inverter circuit IV66 is independent from an output node BUF_N signal. As shown in FIG. 6, one of power sources on the low potential side of the buffer circuit BUF and the level shift circuit LS is the second low potential side power source node Vss2 and the other is the first low potential side power source node Vss and they have different voltages, and therefore, wiring of the output nodes BUF_P and BUF_N connecting the two circuits sometimes becomes long because of layout design. Then, parasitic capacitances generated at the output node BUF_P and BUF_N become large, and a signal waveform may be deteriorated if the oscillation frequency is high. In order to avoid that the output node BUF_P is outputted using the output node BUF_N having deteriorated signal waveform as an input of the inverter circuit IV66, the configuration shown in FIG. 11 is used. In this buffer circuit BUF, the output node BUF_P is outputted through the inverter circuits IV110, IV111 and IV66, and the output node BUF_N is outputted through the inverter circuits IV110, IV65. Thereby, the output nodes BUF_P and BUF_N having a possibility of deterioration of the signal waveform is prevented from being mixed into a path generating the other signal, and it can be avoided that the signal waveform is further deteriorated when the oscillation frequency becomes high.

Fourth Embodiment

In the first embodiment described above, a configuration in which the frequency comparison circuit FREQ_COMP and the phase reverse detection circuit REV_DET are connected directly with the charge pump control circuit CP_CNTL is described. In a fourth embodiment, a configuration in which a circuit extending a time width of a signal is provided therebetween is described.

In a case where the frequencies of the reference signal CLK_REF and the feedback signal CLK_FB differ for greater than or equal to a certain extent, it is preferable that the frequency comparison circuit FREQ_COMP and the phase reverse detection circuit REV_DET output the output S_REF or S_FB of the frequency comparison circuit indicating that the frequencies are different and the output S_REV1 or S_REV2 of the phase reverse detection circuit indicating that the phases are reversed every cycle, and the control signal S_UH or S_DH greatly changing the oscillation frequency is outputted every cycle. However, in the frequency comparison circuit FREQ_COMP and the phase reverse detection circuit REV_DET described heretofore, a cycle in which signals are not outputted to the outputs S_REF and S_FB of the frequency comparison circuit and the outputs S_REV1 and S_REV2 of the phase reverse detection circuit may occur depending on timing relationship even if the frequencies of the reference signal CLK_REF and the feedback signal CLK_FB greatly differ. And, if the frequencies of the reference signal CLK_REF and the feedback signal CLK_FB become close to about two to one, a frequency of outputting signals to the output S_REF or S_FB of the frequency comparison circuit or to the output S_REV1 or S_REV2 of the phase reverse detection circuit is reduced to about once in every two cycles.

In the fourth embodiment of the present invention, the time widths of the output S_REF or S_FB of the frequency comparison circuit and the output S_REV1 or S_REV2 of the phase reverse detection circuit are extended by one cycle, and therefore, a signal greatly changing the oscillation frequency is outputted almost every cycle if the frequencies of the reference signal CLK_REF and the feedback signal CLK_FB differ for greater than or equal to about two to one. Note that, if a mechanism preventing excessive control from being performed even if the signal is continuously outputted to the output S_REF or S_FB of the frequency comparison circuit when the frequencies of the reference signal CLK_REF and the feedback signal CLK_FB are substantially equal as mentioned above is provided in the charge pump control circuit CP_CTNL, false operation due to extension of the time width of the signal does not occur.

Figure 12:
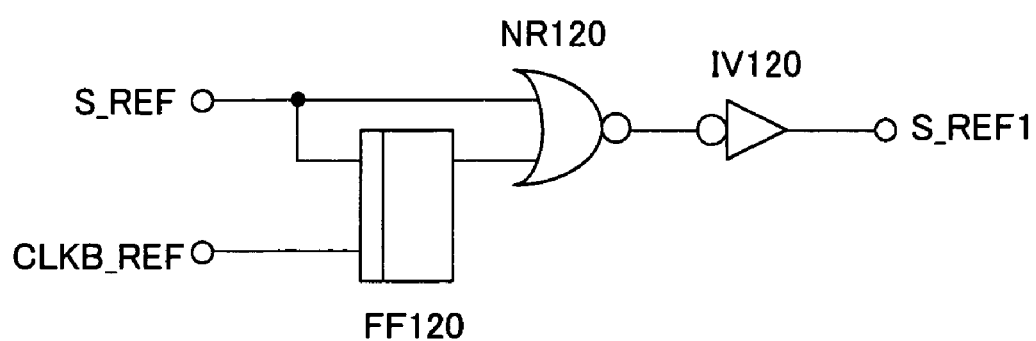
FIG. 12 is a circuit diagram showing a detailed configuration example of a circuit extending a time width of a signal in a PLL circuit according to a fourth embodiment of the present invention.

FIG. 12 is a circuit diagram showing a configuration example of a circuit extending the time width of the output S_REF of the frequency comparison circuit for one cycle in the fourth embodiment of the present invention. The circuit of FIG. 12 is configured by a flip-flop circuit FF120, a NOR circuit NR120 and an inverter circuit IV120. The output S_REF of the frequency comparison circuit FREQ_COMP is connected to a data input terminal of the flip-flop circuit FF120 and one input terminal of the NOR circuit NR120. The inverted reference signal CLKB_REF is connected to a clock trigger input terminal of the flip-flop circuit FF120, and the output terminal of the flip-flop circuit FF120 is connected to the other input terminal of the NOR circuit NR120. Thereby, the output S_REF of the frequency comparison circuit of one cycle before is stored in the flip-flop circuit FF120, and a NOR operation result of the output S_REF of the frequency comparison circuit one cycle before and that in present is obtained at the output terminal of the NOR circuit NR120. By inverting the same by the inverter circuit IV120, a signal S_REF1 in which the time width of the output S_REF of the frequency comparison circuit is extended by one cycle is obtained. This signal is connected to an S_REF input terminal of the charge pump control circuit CP_CNTL. As for other signals (the output S_FB of the frequency comparison circuit, the output S_REV1, S_REV2 of the phase reverse detection circuit) also, the time width can be extended by one cycle by a similar circuit.

And, in the first embodiment, since the pulse width of the output S_FB of the frequency comparison circuit FREQ_COMP is normally equal to a cycle of the feedback signal CLK_FB, if the control starts with a state in which the frequency of the feedback signal is extremely high as an initial state (in a case transiting from a state in which the circuit is used at a high frequency to a state in which the circuit is used at a low frequency), the pulse width of the output S_FB of the frequency comparison circuit becomes shorter than the cycle of the inverted reference signal CLKB_REF. Therefore, in the first embodiment, timing design must be carefully considered so that the signal of the output S_FB of the frequency comparison circuit FREQ_COMP is surely taken into the charge pump control circuit CP_CNTL.

In the fourth embodiment, the pulse width of the output S_FB of the frequency comparison circuit is extended by one cycle of the inverted reference signal CLKB_REF, and therefore, the timing design becomes easy.

Fifth Embodiment

In the first embodiment, a configuration in which an output of the voltage controlled oscillator circuit VCO is frequency-divided by the frequency division circuit DIV and the clock signal CLK_OUT is outputted is described. In the fifth embodiment, a configuration in which the clock signal CLK_OUT is directly outputted from the voltage controlled oscillator circuit VCO is described as shown in FIG. 13.

Figure 13:
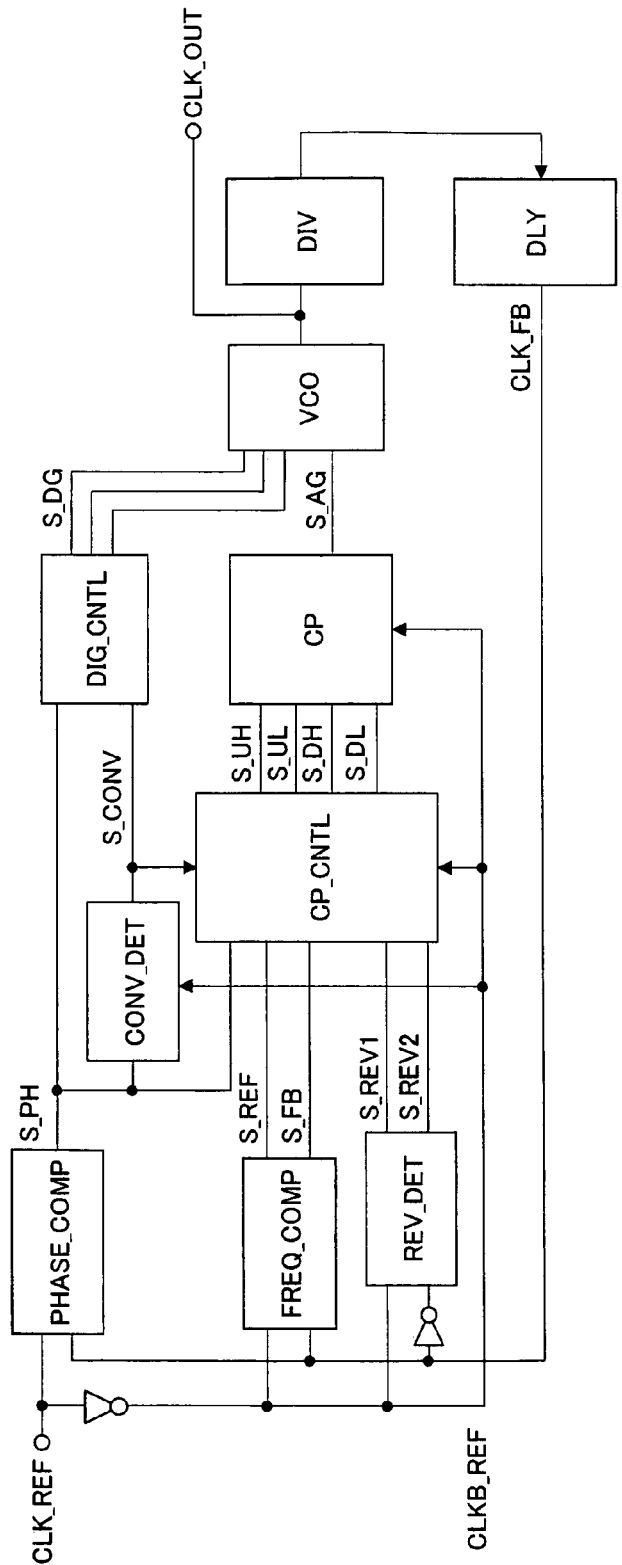
FIG. 13 is a block diagram showing a configuration example of a PLL circuit according to a fifth embodiment of the present invention.

The configuration shown in FIG. 13 has a feature that an upper limit frequency of the clock signal outputted as the clock signal CLK_OUT is higher in comparison with the configuration shown in FIG. 1. If the same circuit is used as the voltage controlled oscillator circuit VCO, since the upper limit oscillation frequency is the same, the configuration of FIG. 13 outputting the signal with a frequency unchanged can output the signal at a higher frequency than the configuration of FIG. 1 outputting at half or lower frequency.

On the other hand, in comparison with the configuration shown in FIG. 13, the configuration shown in FIG. 1 has a feature that a pulse width of the clock signal outputted as the clock signal CLK_OUT can be accurately made to half of the clock cycle. By outputting the clock signal CLK_OUT from the frequency division circuit DIV, both of a rising edge and a falling edge of the clock signal CLK_OUT can be synchronized with the output of the voltage controlled oscillator circuit VCO, and therefore, the pulse width can be accurately controlled. And, also in a case of outputting clock signals of plural phases, the configuration of FIG. 1 is more easy to use.

It depends on a purpose and conditions of using the PLL circuit that which configuration of FIG. 1 and FIG. 13 is suitable.

Other Embodiments

In the first embodiment, the configuration in which the output S_CONV of the steady state detection circuit CONV_DET is used by both of the digital control circuit DIG_CNTL and the charge pump control circuit CP_CNTL and both of the control width of the oscillation frequency by the digital control signal S_DG and the frequency of changing the analog control signal S_AG are changed depending on whether the steady state has been reached. As other embodiments, a configuration in which only the control width of the oscillation frequency by the digital control signal S_DG is changed depending on whether the steady state has been reached, and a configuration of in which only the frequency of changing the analog control signal S_AG is changed depending on whether the steady state has been reached can be employed. Furthermore, a configuration in which one of the digital control signals S_DG to be fixed to a low level or one to be fixed to a high level in the steady state is omitted and the control is performed by two bits may can be adopted. In any case, the effect of the present invention is not as significant as the PLL circuit according to the first embodiment of the present invention, but the effect of the present invention can be expected to a certain extent.

And, also a configuration in which two sets of portions TIMER detecting that a predetermined time is elapsed in the steady state detection circuit CONV_DET are provided and two types of the predetermined times for determining whether the steady state has been reached are provided can be adopted. In this case, condition for determining whether the steady state has been reached for changing the control width of the oscillation frequency by the digital control signal and condition for determining whether the steady state has been reached for changing the frequency of changing the analog control signal can be separately set, and therefore, suitable design can be performed respectively.

In the foregoing, the invention made by the inventor of the present invention has been concretely described based on the embodiments. However, it is needless to say that the present invention is not limited to the foregoing embodiments and various modifications and alterations can be made within the scope of the present invention.

For example, in the embodiments described above, a MOS transistor is used as a transistor, but it can be replaced by a bipolar transistor and the like, of course. And, in FIG. 6 and the like, a transistor is provided in the low potential power source side and the oscillation frequency is controlled by a gate potential thereof, but similarly, it is possible to provide a transistor in the high potential power source side and control the oscillation frequency by a gate potential thereof.

The PLL circuit of the present invention is technique effectively applied in particular to a clock signal providing unit in a semiconductor integrated circuit device, but is not limited thereto, and can be applied widely to various integrated circuit devices in which a high speed or high accuracy clock signal is required.

What is claimed is:

1. A PLL circuit comprising:
    a voltage controlled oscillator controlled by an analog control signal controlling an oscillation frequency over a first range and a digital control signal controlling the oscillation frequency over a range narrower than the first range;
    a frequency comparison circuit comparing one of a frequency of an output of the voltage controlled oscillator and a frequency of a signal obtained by frequency-dividing the output of the voltage controlled oscillator; and a frequency of a reference signal; and
    a phase comparison circuit comparing one of a phase of the output of the voltage controlled oscillator and a phase of the signal obtained by frequency-dividing the output of the voltage controlled oscillator; and a phase of the reference signal,
    wherein the PLL circuit is configured to control the oscillation frequency of the voltage controlled oscillator so that a frequency and a phase of one of the output of the voltage controlled oscillator and the signal obtained by frequency-dividing the output of the voltage controlled oscillator conform to the frequency and the phase of the reference signal,
    wherein a first circuit determining whether control of the oscillation frequency of the voltage controlled oscillator has reached a steady state is provided, and
    wherein at least one of a second circuit operating only when determination that the steady state has not been reached is made and a third circuit operating only when determination that the steady state has been reached is made is provided.

2. The PLL circuit according to claim 1,
    wherein the first circuit has a function determining whether a comparison result of the phase comparison circuit is in a same state for a time longer than or equal to a first time.

3. The PLL circuit according to claim 2,
    wherein the first time is a time corresponding to four cycles of the reference signal.

4. The PLL circuit according to claim 1,
    wherein a frequency of changing the analog control signal is reduced when the first circuit determines that the steady state has not been reached, in comparison with a case when the first circuit determines that the steady state has been reached.

5. The PLL circuit according to claim 2,
    wherein a frequency of changing the analog control signal is reduced when the comparison result of the phase comparison circuit is in a same state for a time longer than or equal to the first time, in comparison with a case when the comparison result of the phase comparison circuit changes in a time shorter than the first time.

6. The PLL circuit according to claim 3,
    wherein a frequency of changing the analog control signal is reduced when the comparison result of the phase comparison circuit is in a same state for a time longer than or equal to the first time, in comparison with a case when the comparison result of the phase comparison circuit changes in a time shorter than the first time.

7. The PLL circuit according to claim 4,
    wherein the analog control signal is changed for every second time when the first circuit determines that the steady state has not been reached, and
    wherein the analog control signal is changed for every one cycle of the reference signal when the first circuit determines that the steady state has been reached.

8. The PLL circuit according to claim 5,
    wherein the analog control signal is changed for every second time when the comparison result of the phase comparison circuit is in a same state for a time longer than or equal to the first time, and
    wherein the analog control signal is changed for every one cycle of the reference signal when the comparison result of the phase comparison circuit changes in a time shorter than the first time.

9. The PLL circuit according to claim 6,
    wherein the analog control signal is changed for every second time when the comparison result of the phase comparison circuit is in a same state for a time longer than or equal to the first time, and
    wherein the analog control signal is changed for every one cycle of the reference signal when the comparison result of the phase comparison circuit changes in a time shorter than the first time.

10. The PLL circuit according to claim 7,
    wherein the second time corresponds to a time longer than or equal to eight cycles of the reference signal.

11. The PLL circuit according to claim 8,
    wherein the second time corresponds to a time longer than or equal to eight cycles of the reference signal.

12. The PLL circuit according to claim 9,
    wherein the second time corresponds to a time longer than or equal to eight cycles of the reference signal.

13. The PLL circuit according to claim 1,
    wherein the digital control signal is composed of a digital signal of at least two bits,
    wherein only one bit of the digital control signal is changed based on a comparison result of the phase comparison circuit and other bit or other bits are fixed at predetermined values respectively when the first circuit determines that the steady state has been reached, and
    wherein at least the other bit or the other bits are changed based on the comparison result of the phase comparison circuit when the first circuit determines that the steady state has not been reached.

* * * * *